United States Patent
Hyun et al.

(10) Patent No.: US 12,159,681 B2
(45) Date of Patent: Dec. 3, 2024

(54) TEST SYSTEMS CONFIGURED TO PERFORM TEST MODE OPERATIONS FOR MULTIPLE MEMORY DEVICES

(71) Applicant: SK hynix Inc., Icheon-si (KR)

(72) Inventors: Sang Ah Hyun, Icheon-si (KR); Yong Ho Seo, Icheon-si (KR); Woo Sik Jung, Icheon-si (KR); Jun Phyo Lee, Icheon-si (KR); Bong Hwa Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/116,019

(22) Filed: Mar. 1, 2023

(65) Prior Publication Data
US 2024/0161851 A1    May 16, 2024

(30) Foreign Application Priority Data
Nov. 11, 2022    (KR) .................. 10-2022-0150822

(51) Int. Cl.
| | | |
|---|---|---|
| G11C 29/38 | (2006.01) | |
| G11C 29/12 | (2006.01) | |
| G11C 29/18 | (2006.01) | |
| G11C 29/40 | (2006.01) | |

(52) U.S. Cl.
CPC ........ *G11C 29/38* (2013.01); *G11C 29/12015* (2013.01); *G11C 29/18* (2013.01); *G11C 29/40* (2013.01); *G11C 2029/1802* (2013.01)

(58) Field of Classification Search
CPC ... G11C 29/38; G11C 29/12015; G11C 29/18; G11C 2029/1802
See application file for complete search history.

(56) References Cited

U.S. PATENT DOCUMENTS

| | | | | |
|---|---|---|---|---|
| 9,817,065 | B2 * | 11/2017 | Kim ................. | G01R 31/31701 |
| 10,134,484 | B2 * | 11/2018 | Kwak .............. | G01R 31/31701 |
| 2008/0244157 | A1 * | 10/2008 | Kim ....................... | G11C 29/20 |
| | | | | 711/E12.001 |

FOREIGN PATENT DOCUMENTS

KR    1020080089015 A    10/2008

* cited by examiner

*Primary Examiner* — Cynthia Britt
(74) *Attorney, Agent, or Firm* — WILLIAM PARK & ASSOCIATES LTD.

(57) ABSTRACT

A test system includes a test device configured to output a command address and a test dock for performing a test mode and to receive a comparison signal, and a memory device configured to enter the test mode, based on the command address, to set an initial value by the command address, to perform a calculation operation on the initial value according to a logic level combination of the command address to generate a row address and a command address during a pre-charge operation, and to compress and compare internal data output based on the row address and the column address to output the internal data as the comparison signal to the test device.

36 Claims, 25 Drawing Sheets

FIG. 4

| OPERATION | ICAR<1> | ICAR<2> | ICAR<3> | ICAR<4> |
|---|---|---|---|---|
| ACT | X | H | H | X |
| RD | L | H | H | H |
| PCG | H | H | X | X |

FIG. 7

| OPERATION | ICAF<1> | ICAF<2> | ICAF<3> | ICAF<4> |
|---|---|---|---|---|
| HOLD | L | L | L | L |
| INVERSION | H | H | L | L |
| INCREASE/ DECREASE | H/L | H/L | H | H |

FIG. 8

| OPERATION | ICAF<1> | ICAF<2> | ICAF<3> | ICAF<4> |
|---|---|---|---|---|
| RADD DEC / CADD DEC | L | L | H | H |
| RADD DEC / CADD INC | L | H | H | H |
| RADD INC / CADD DEC | H | L | H | H |
| RADD INC / CADD INC | H | H | H | H |

FIG. 9

| OPERATION | ICAF<1> | ICAF<2> | ICAF<3> | ICAF<4> |
|---|---|---|---|---|
| FIRST ROW INPUT | RADD<1> | RADD<2> | RADD<3> | RADD<4> |
| SECOND ROW INPUT | RADD<5> | RADD<6> | RADD<7> | RADD<8> |
| FIRST COL INPUT | CADD<1> | CADD<2> | CADD<3> | CADD<4> |
| SECOND COL INPUT | CADD<5> | CADD<6> | CADD<7> | CADD<8> |

TEST SYSTEMS CONFIGURED TO PERFORM TEST MODE OPERATIONS FOR MULTIPLE MEMORY DEVICES

CROSS-REFERENCE TO RELATED APPLICATIONS

The present application claims priority under 35 U.S.C. 119(a) to Korean Patent Application No. 10-2022-0150822, filed on Nov. 11, 2022, which is incorporated herein by reference in its entirety.

BACKGROUND

1. Technical Field

Embodiments of the present disclosure generally relate to test methods, and more particularly to test methods and test systems configured to perform test mode operations for a plurality of memory devices including different operation characteristics.

2. Related Art

In general, in order for memory devices to start operating, test mode operations are performed in which internal circuits are tested for defects, so that only memory devices without defects can operate normally. Therefore, the test mode operations for testing the operations of the memory devices have a very important meaning.

In order to perform the test mode operations on the memory devices, it is necessary to be able to test tens of millions of cells at high speed. In particular, because the reduction of a development period of the memory devices and the reduction of a test time until product shipment directly affects the product cost, the reduction of the test time acts as a very important issue in terms of production efficiency and competition among manufacturers. Therefore, in order to reduce the test time, a compression parallel test that compresses, compares, and outputs a plurality of pieces of data has been proposed.

Meanwhile, with technological development, various devices to which memory devices are applied have been developed. Representatively, a double data rate (DDR) device that inputs and outputs data by synchronizing data to a rising edge and a falling edge of a clock, a low power double data rate (LPDDR) device used in mobile devices, and the like are being developed. As such, various methods are required to test various memory devices.

SUMMARY

An embodiment of the present disclosure may provide a test system including a test device configured to output a command address and a test clock for performing a test mode and to receive a comparison signal, and a memory device configured to enter the test mode, based on the command address, to set an initial value by the command address, to perform a calculation operation on the initial value according to a logic level combination of the command address to generate a row address and a command address during a pre-charge operation, and to compress and compare internal data output based on the row address and the column address to output the internal data as the comparison signal to the test device.

An embodiment of the present disclosure may provide a test system including a test device configured to output a command address and a test dock for performing a test mode, and to receive first and second comparison signals, a first memory device configured to enter the test mode based on the command address during a normal mode, to output first internal data of a location selected by performing a calculation operation on a first initial value set by the command address, and to compress and compare the first internal data to output as the first comparison signal to the test device, and a second memory device configured to enter the test mode based on the command address during the normal mode, to output second internal data of a location selected by performing a calculation operation on a second initial value set by the command address, and to compress and compare the second internal data to output as the second comparison signal to the test device, wherein the first memory device and the second memory device may have different operation characteristics from each other.

An embodiment of the present disclosure may provide a test method, the test method may include outputting a command address, a test dock, and first and second input data for controlling a test mode, and performing a test mode based on the command address in synchronization with the test clock, wherein the command address and the test dock may be output to a first memory device and a second memory device that have different operation characteristics, the first input data may be output to the first memory device, and the second input data may be output to the second memory device.

BRIEF DESCRIPTION OF THE DRAWINGS

FIG. 4 is a table illustrating an operation of a test decoder included in the command generating circuit illustrated in FIG. 3.

FIGS. 7, 8 and 9 are tables illustrating an operation of the address decoder illustrated in FIG. 6.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level may be set to have a logic "low" level according to embodiments, and a signal having a logic "low" level may be set to have a logic "high" level according to embodiments.

Various embodiments of the present disclosure will be described hereinafter in more detail with reference to the accompanying drawings. However, the embodiments described herein are for illustrative purposes only and are not intended to limit the scope of the present disclosure.

Figure 1:
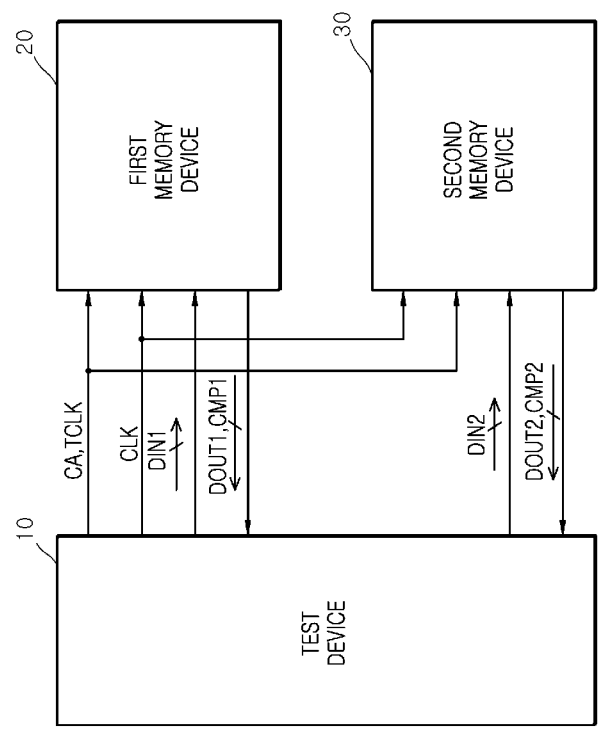
FIG. 1 is a block diagram illustrating a configuration of a test system according to an embodiment of the present disclosure.

FIG. 1 is a block diagram illustrating a configuration of a test system 1 according to an embodiment of the present disclosure. As illustrated in FIG. 1, the test system 1 according to an embodiment of the present disclosure may include a test device 10, a first memory device 20, and a second memory device 30.

The test device 10 may be implemented as a device capable of controlling a test mode operation of testing the operations of the first memory device 20 and the second memory device 30. The test device 10 may output a command address CA, a dock CLK, and first input data DIN1 for controlling a normal mode to the first memory device 20. The test device 10 may receive first output data DOUT1 from the first memory device 20 in the normal mode. The test device 10 may output a command address CA, a clock CLK, and second input data DIN2 for controlling the normal mode to the second memory device 30. The test device 10 may receive second output data DOUT2 from the second memory device 30 in the normal mode.

The command address CA may be set as a signal including a command and an address for controlling the normal mode operations of the first memory device 20 and the second memory device 30. The clock CLK may be set as a signal that is periodically toggled in the normal mode. The first input data DIN1 may be set as data including a plurality of bits to be stored in the first memory device 20 during a write operation in the normal mode. The first output data DOUT1 may be set as data including a plurality of bits that are output from the first memory device 20 during a read operation in the normal mode. The second input data DIN2 may be set as data including a plurality of bits to be stored in the second memory device 30 during the write operation in the normal mode. The second output data DOUT2 may be set as data including a plurality of bits that are output from the second memory device 30 during the read operation in the normal mode.

The test device 10 may output a command address CA, a test clock TCLK, and first input data DIN1 for controlling the test mode to the first memory device 20. The test device 10 may receive a first comparison signal CMP1 from the first memory device 20 in the test mode. The test device 10 may output a command address CA, a test clock TCLK, and second input data DIN2 for controlling the test mode to the second memory device 30. The test device 10 may receive a second comparison signal CMP2 from the second memory device 30 in the test mode. The test device 10 may store a period and a preset pulse width of the test clock TCLK used in the first memory device 20 and the second memory device 30. The test device 10 may output the test clock TCLK having the preset pulse width to the first memory device 20 and the second memory device 30 in the test mode.

The command address CA may be set as a signal including a command and an address for controlling the test mode operations of the first memory device 20 and the second memory device 30. The test clock TCLK may be set as a signal that is periodically toggled to latch the command address CA when entering the test mode and has a preset pulse width during a read operation of the test mode. The preset pulse width of the test clock TCLK may be set to a pulse width that is greater than an interval from a time point when the command address CA for performing the read operation is output to a time point when the data stored in the first memory device 20 and the second memory device 30 is output. The preset pulse width of the test clock TCLK may be generated with a pulse width that is greater than an address access time (tAA), which is a time interval from the output of the command address CA for performing the read operation to the output of the data. The preset pulse width of the test dock TCLK may be set in various ways according to embodiments. For example, the preset pulse width of the test dock TCLK may be set to a pulse width that is greater than a physical internet delay time required by the memory device. The preset pulse width of the test dock TCLK may be set to a pulse width that is greater than time intervals, such as active to read time (tRCD) and write to pre-charge time (tWR). The first comparison signal CMP1 may be set to a signal that is generated by comparing and compressing data including a plurality of bits stored in the first memory device 20. The second comparison signal CMP2 may be set to a signal that is generated by comparing and compressing data including a plurality of bits stored in the second memory device 30.

The first memory device 20 may perform normal mode operations, based on the command address CA. When performing a write operation based on the command address CA in the normal mode, the first memory device 20 may store the first input data DIN1 that is input in synchronization with the dock CLK therein. When performing a read operation based on the command address CA in the norm& mode, the first memory device 20 may output data stored therein as the first output data DOUT1 in synchronization with the clock CLK. The first memory device 20 may be implemented with a memory device that performs operations such as an active operation, a write operation, a read operation, and a pre-charge operation in the normal mode, based on the command address CA. In an embodiment, the first memory device 20 may be implemented as, for example but not limited to, a general memory device that performs operations such as an active operation, a write operation, a read operation, and a pre-charge operation in the normal mode, based on the command address CA.

The first memory device 20 may perform test mode operations, based on the command address CA. The first memory device 20 may set an initial value of an address that is set by the command address in the test mode. The first memory device 20 may change a logic level combination of the address by performing a calculation operation on the initial value that is set by the command address CA during a pre-charge operation in the test mode. The first memory device 20 may store the first input data DIN1 at a location selected by an address having a logic level combination that is changed during a write operation in the test mode. The first memory device 20 may output the data stored in the location selected by the address having a logic level combination that is changed during a read operation in the test mode, and may output the first comparison signal CMP1 generated by compressing and comparing bits included in the output data. The operation of comparing and compressing the bits included in the data output from the first memory device 20 means a compression parallel test.

The second memory device 30 may perform normal mode operations, based on the command address CA. When performing a write operation based on the command address CA in the normal mode, the second memory device 30 may store second input data DIN2 that is input in synchronization with the clock CLK therein. When performing a read operation based on the command address CA in the normal mode, the second memory device 30 may output the data that is stored therein in synchronization with the clock CLK as the second output data DOUT2. The second memory device 30 may be implemented as a memory device that performs operations such as an active operation, a write operation, a read operation, and a pre-charge operation in the normal mode, based on the command address CA. In an embodiment, the second memory device 30 may be implemented as, for example but not limited to, a general memory device that performs operations such as an active operation, a write operation, a read operation, and a pre-charge operation in the normal mode, based on the command address CA.

The second memory device 30 may perform test mode operations, based on the command address CA. The second memory device 30 may set an initial value of an address that is set by the command address CA in the test mode. During the pre-charge operation in the test mode, the second memory device 30 may change the logic level combination of the address by performing a calculation operation on the initial value set by the command address CA. The second memory device 30 may store the second input data DIN2 at a location selected by the address having a logic level combination that is changed during a write operation in the test mode. The second memory device 30 may output the data stored in the location selected by the address having a logic level combination that is changed during a read operation in the test mode, and may output the second comparison signal CMP2 generated by comparing and compressing bits included in the output data. The operation of comparing and compressing the bits included in the data output from the second memory device 30 means a compression parallel test.

The first memory device 20 and the second memory device 30 may be implemented as memory devices having different operation characteristics. For example, the first memory device 20 may be implemented as a double data rate (DDR) device that inputs and outputs data in synchronization with a rising edge and a falling edge of the clock CLK. The second memory device 30 may be implemented as a low power double data rate (LPDDR) device that receives a low voltage used in a mobile device and inputs and outputs data. Although the test device 10 is illustrated to perform the test mode operations for the first memory device 20 and the second memory device 30 in FIG. 1, according to embodiments, the test device 10 may perform the test mode operations for various memory devices, so that various memory devices may be tested through one test device 10.

Figure 2:
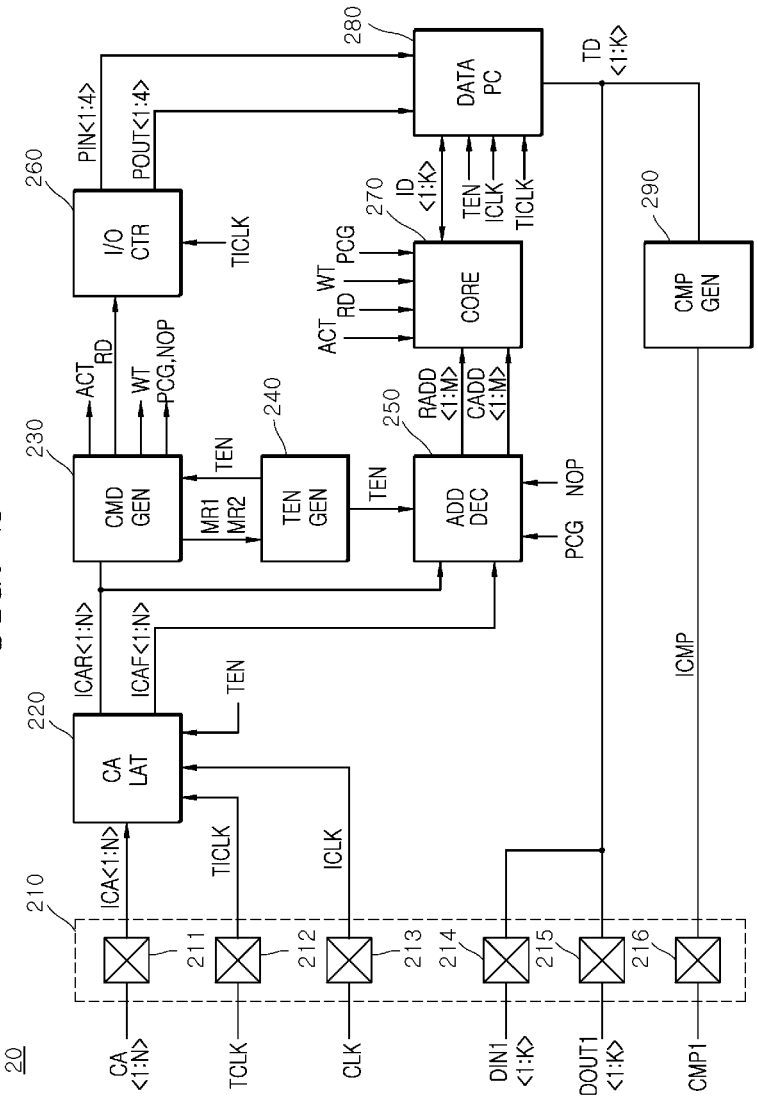
FIG. 2 is a block diagram illustrating a configuration according to an embodiment of a first memory device included in the test system illustrated in FIG. 1.

FIG. 2 is a block diagram illustrating a configuration according to an embodiment of the first memory device 20 illustrated in FIG. 1. As illustrated in FIG. 2, the first memory device 20 may include a pad circuit 210, a command address latch circuit 220, a command generating circuit 230, a test enable signal generating circuit 240, an address decoder 250, an input/output control circuit 260, a core circuit 270, a data processing circuit 280, and a comparison signal generating circuit 290.

The pad circuit 210 may include a first pad 211, a second pad 212, a third pad 213, a fourth pad 214, a fifth pad 215, and a sixth pad 216. The first pad 211 may receive the command address CA<1:N> to generate an input command address ICA<1:N>. Each of the command address CA<1:N> and the input command address ICA<1:N> may include N bits. Although the first pad 211 is illustrated as a single pad, the first pad 211 may be implemented with N pads, equal to the number of bits of each of the command address CA<1:N> and the input command address ICA<1:N>. The number of bits "N" of each of the command address CA<1:N> and the input command address ICA<1:N> may be set to a natural number. The second pad 212 may receive the test clock TCLK to generate an input test clock TICLK. The test clock TCLK is set to be received through the second pad 212, but may be set to be received through one of the pads included in the first pad 211. The third pad 213 may receive the clock CCK to generate an input clock ICLK. The fourth pad 214 may receive the first input data DIN1<1:K> to generate transfer data TD<1:K> during a write operation. Each of the first input data DIN1<1:K> and the transfer data TD<1:K> may include K bits. Although the fourth pad 214 is illustrated as a single pad, the fourth pad 214 may be implemented with K pads, equal to the number of bits of each of the first input data DIN1<1:K> and the transfer data TD<1:K>. The fifth pad 215 may receive the transfer data TD<1:K> to generate the first output data DOUT1<1:K> during a read operation. Each of the transfer data TD<1:K> and the first output data DOUT1<1:K> may include K bits. Although the fifth pad 215 is illustrated as a single pad, the fifth pad 215 may be implemented with K pads, equal to the number of bits of each of the transfer data TD<1:K> and the first output data DOUT1<1:K>. The sixth pad 216 may receive an internal comparison signal ICMP to generate the first comparison signal CMP1. The first comparison signal CMP1 is set to be output through the sixth pad 216, but may be set to be output through one of the pads included in the fifth pad 215.

The command address latch circuit 220 may latch the input command address ICA<1:N> in synchronization with the input clock ILCK, based on a test enable signal TEN to generate a rising command address ICAR<1:N> and a falling command address ICAF<1:N>. The command address latch circuit 220 may latch the input command address ICA<1:N> in synchronization with a rising edge of the input clock ICLK when the test enable signal TEN is disabled in a normal mode to generate the rising command address ICAR<1:N>. The command address latch circuit 220 may latch the input command address ICA<1:N> in synchronization with a falling edge of the input clock ICLK when the test enable signal TEN is disabled in the normal mode to generate a falling command address ICAF<1:N>. Each of the rising command address ICAR<1:N> and the falling command address ICAF<1:N> may include N bits, equal to the number of bits of the input command address ICA<1:N>.

The command address latch circuit 220 may latch the input command address ICA<1:N> in synchronization with a rising edge of the input test dock TICLK when the test enable signal TEN is enabled in a test mode to generate the rising command address ICAR<1:N>. The command address latch circuit 220 may latch the input command address ICA<1:N> in synchronization with a falling edge of the input test clock TICLK when the test enable signal TEN is enabled in the test mode to generate the falling command address ICAF<1:N>.

The command generating circuit 230 may generate an active command ACT, a read command RD, a write command WT, a pre-charge command PCG, and an operation command NOP according to a logic level combination of the rising command address ICAR<1:N>, based on the test enable signal TEN. The command generating circuit 230 may generate the active command ACT, the read command RD, the write command WT, the pre-charge command PCG, and the operation command NOP according to the logic level combination of the rising command address ICAR<1:N> when the test enable signal TEN is disabled in the normal mode. The command generating circuit 230 may generate a first mode register command MR1 according to the logic level combination of the rising command address ICAR<1:N>, and may delay the first mode register command MR1 by a test mode section to generate a second mode register command MR2 when the test enable signal TEN is disabled in the normal mode. The command generating circuit 230 may generate the active command ACT, the read command RD, and the pre-charge command PCG according to the logic level combination of first to fourth bits ICAR<1:4> of the rising command address ICAR<1:N> when the test mode enable signal TEN is enabled in the test mode.

The active command ACT may be set as a command for performing an active operation to activate a plurality of banks included in the core circuit 270. The read command RD may be set as a command for performing a read operation to output internal data ID<1:K> stored in the core circuit 270. The write command WT may be set as a command for performing a write operation to store the internal data ID<1:K> in the core circuit 270. The pre-charge command PCG may be set as a command for performing a pre-charge operation to drive bit lines included in the core circuit 270 to a set voltage level. The operation command NOP may be set as a signal for not operating the core circuit 270. The first mode register command MR1 may be set as a signal for entering the test mode. The second mode register command MR2 may be set as a signal for ending the test mode. The logic level combinations of the rising command address ICAR<1:N> for generating the active command ACT, the read command RD, the write command WT, the pre-charge command PCG, the operation command NOP, the first mode register command MR1, and the second mode register command MR2 may be set to different logic level combinations. The logic level combinations of the rising command address ICAR<1:N> for generating the active command ACT, the read command RD, the write command WT, the pre-charge command PCG, the operation command NOP, the first mode register command MR1, and the second mode register command MR2 may be set in various ways according to embodiments.

The test enable signal generating circuit 240 may generate the test enable signal TEN, based on the first mode register command MR1 and the second mode register command MR2. The test enable signal generating circuit 240 may generate the test enable signal TEN that is enabled from a point in time when the first mode register command MR1 is enabled to a point in time when the second mode register command MR2 is enabled.

The address decoder 250 may generate a row address RADD<1:M> and a column address CADD<1:M> from the rising command address ICAR<1:N> and the falling command address ICAF<1:N>, based on the test enable signal TEN. The address decoder 250 may generate the row address RADD<1:M> and the column address CADD<1:M> from the rising command address ICAR<1:N> and the falling command address ICAF<1:N> when the test enable signal TEN is disabled in the normal mode. The address decoder 250 may receive the first to fourth bits ICAF<1:4> of the falling command address ICAF<1:N> to set an initial value according to the logic level combinations of the first to fourth bits ICAR<1:4> of the rising command address ICAR<1:N> among the logic level combinations of the rising command address ICAR<1:N> when the test enable signal TEN is enabled in the test mode. The address decoder 250 may perform a calculation operation on the initial value to generate the row address RADD<1:M> and the column address CADD<1:M> according to the logic level combinations of the first to fourth bits ICAF<1:4> of the falling command address ICAF<1:N> when the test enable signal TEN is enabled and either the pre-charge command PCG or the operation command NOP is enabled in the test mode. Each of the row address RADD<1:M> and the column address CADD<1:M> may include M bits.

The input/output control circuit 260 may generate an input control signal PIN<1:4> and an output control signal POUT<1:4> in synchronization with the input test clock TICLK when the read command RD is enabled. The input/output control circuit 260 may generate the input control signal PIN<1:4> and the output control signal POUT<1:4> that are sequentially enabled in synchronization with the input test clock TICLK when the read command RD is enabled. For example, the input/output control circuit 260 may generate a first bit PIN<1> of the input control signal PIN<1:4> and a first bit POUT<1> of the output control signal POUT<1:4> which are enabled in synchronization with the input test clock TICLK when a first read command RD is enabled. The input/output control circuit 260 may generate a second bit PIN<2> of the input control signal PIN<1:4> and a second bit POUT<2> of the output control signal POUT<1:4> which are enabled in synchronization with the input test clock TICLK when a second read command RD is enabled. Each of the input control signal PIN<1:4> and the output control signal POUT<1:4> is implemented to include 4 bits, but may be generated to include various bits according to embodiments.

The core circuit 270 may be implemented to include a plurality of banks (not shown) and a plurality of memory cells (not shown). The core circuit 270 may perform normal mode operations, based on the active command ACT, the read command RD, the pre-charge command PCG, the row address RADD<1:M>, and the column address CADD<1:M>. The core circuit 270 may perform an active operation in which one of the plurality of banks (not shown) is activated when the active command ACT is enabled. The core circuit 270 may perform a read operation of outputting the internal data ID<1:K> that is stored in a selected region, based on the row address RADD<1:M> and the column address CADD<1:M> when the read command RD is enabled. The core circuit 270 may perform a write operation of storing the internal data ID<1:K> in the selected region, based on the row address RADD<1:M> and the column address CADD<1:M> when the write command WT is enabled. The core circuit 270 may perform a pre-charge operation of driving bit lines included in the core circuit 270 to a set voltage level when the pre-charge command PCG is enabled. The core circuit 270 illustrated in FIG. 1 may be implemented as a core circuit including a plurality of banks, and each bank includes a plurality of memory cells connected between a plurality of word lines and a plurality of bit lines. In an embodiment, the core circuit 270 may be implements as, for example but not limited to, a general core circuit including a plurality of banks, and each bank includes a plurality of memory cells connected between a plurality of word lines and a plurality of bit lines.

The data processing circuit 280 may latch the internal data ID<1:1> output from the core circuit 270 in synchronization with the input clock ICLK when the test enable signal TEN is disabled and one of bits of the input control signal PIN<1:4> is enabled in a read operation in the normal mode. The data processing circuit 280 may output the latched internal data ID<1:K> as the transfer data TD<1:K> in synchronization with the input clock ICLK when the test enable signal TEN is disabled and one of bits of the output control signal POUT<1:4> is enabled in a read operation in the normal mode. The data processing circuit 280 may latch the transfer data TD-<1:K> in synchronization with the input clock ICLK, and may output the latched transfer data TD<1:K> as the internal data ID<1:K> in a write operation in the normal mode.

The data processing circuit 280 may latch the internal data ID<1:K> output from the core circuit 270 in synchronization with the input test dock TICLK when the test enable signal TEN is enabled and one of the bits of the input control signal PIN<1:4> is enabled in the read operation in the test mode. The data processing circuit 280 may output the latched internal data ID<1:K> as the transfer data TD<1:K> in synchronization with the input test clock TICLK when the test enable signal TEN is enabled and one of the bits of the output control signal POUT 1:4> is enabled in the read operation in the test mode. The data processing circuit 280 may latch the transfer data TD<1:K> in synchronization with the input test clock TICLK in a write operation in the test mode, and may output the latched transfer data TD<1:K> as the internal data ID<1:K>.

The comparison signal generating circuit 290 may compress the bits included in the transfer data TD<1:K> to generate the internal comparison signal ICMP in the test mode. The comparison signal generating circuit 290 may compare the logic levels of the bits included in the transfer data TD<1:K> to generate the internal comparison signal ICMP in the test mode. The comparison signal generating circuit 290 may generate the internal comparison signal ICMP that is enabled at a logic "high" level when all logic levels of the bits included in the transfer data TD<1:K> are the same logic levels, in the test mode.

Meanwhile, because the second memory device 30 illustrated in FIG. 1 has operation characteristics different from those of the first memory device 20 but has the same configuration and performs the same operation, a detailed description thereof will be omitted.

Figure 3:
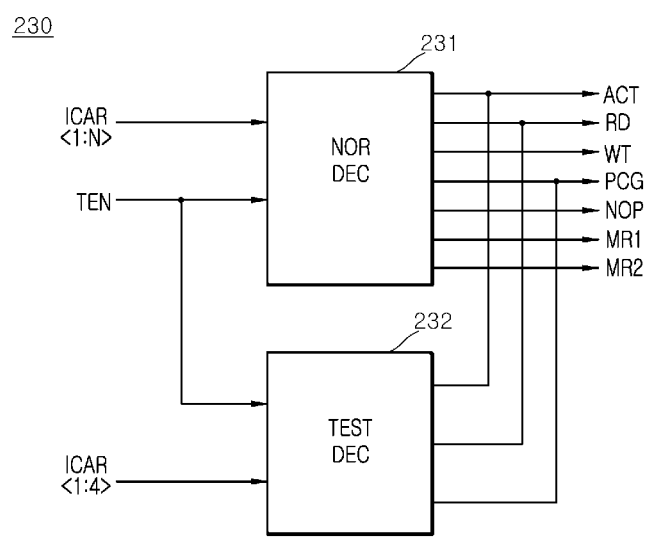
FIG. 3 is a block diagram illustrating a configuration according to an embodiment of a command generating circuit included in the first memory device illustrated in FIG. 2.

FIG. 3 is a block diagram illustrating a configuration according to an embodiment of the command generating circuit 230 illustrated in FIG. 2. As illustrated in FIG. 3, the command generating circuit 230 may include a normal decoder 231 and a test decoder 232.

The normal decoder 231 may generate the active command ACT that is enabled when the logic level combination of the rising command address ICAR<1:N> is a combination for performing the active operation when the test enable signal TEN is disabled in the normal mode. The normal decoder 231 may generate the read command RD that is enabled when the logic level combination of the rising command address ICAR<1:N> is a combination for performing the read operation when the test enable signal TEN is disabled in the normal mode. The normal decoder 231 may generate the write command WT that is enabled when the logic level combination of the rising command address ICAR<1:N> is a combination for performing the write operation when the test enable signal TEN is disabled in the normal mode. The normal decoder 231 may generate the pre-charge command PCG that is enabled when the logic level combination of the rising command address ICAR<1:N> is a combination for performing the pre-charge operation when the test enable signal TEN is disabled in the normal mode. The normal decoder 231 may generate the operation command NOP that is enabled when the logic level combination of the rising command address ICAR<1:N> is a combination for not operating the core circuit 270 when the test enable signal TEN is disabled in the normal mode. The normal decoder 231 may generate the first mode register command MR1 that is enabled when the logic level combination of the rising command address ICAR<1:N> is a combination for performing the test mode operation when the test enable signal TEN is disabled in the normal mode, and may generate the second mode register command MR2 by delaying the first mode register command MR1 by the test mode section.

The test decoder 232 may generate the active command ACT that is enabled when the logic level combination of the first to fourth bits ICAR<1:4> of the rising command address ICAR<1:N> is the combination for performing the active operation when the test enable signal TEN is enabled in the test mode. The test decoder 232 may generate the read command RD that is enabled when the logic level combination of the first to fourth bits ICAR<1:4> of the rising command address ICAR<1:N> is the combination for performing the read operation when the test enable signal TEN is enabled in the test mode. The test decoder 232 may generate the pre-charge command PCG that is enabled when the logic level combination of the first to fourth bits ICAR<1:4> of the rising command address ICAR<1:N> is the combination for performing the pre-charge operation when the test enable signal TEN is enabled in the test mode.

FIG. 4 is a table illustrating the operations of the test decoder 232 illustrated in FIG. 3. The logic level combinations of the first to fourth bits ICAR<1:4> of the rising command address ICAR<1:N> for generating the active command ACT, the read command RD, and the pre-charge command PCG in the test decoder 232 according to an embodiment of the present disclosure will be described with reference to FIG. 4 as follows.

First, the logic level combination of the first to fourth bits ICAR<1:4> of the rising command address ICAR<1:N> for generating the active command ACT will be described as follows.

When the test enable signal TEN is enabled at a logic "high" level H, the test decoder 232 may generate the active command ACT that is enabled at a logic "high" level H when the second bit ICAR<2> of the rising command address ICAR<1:N> is at a logic "high" level H and the third bit ICAR<3> of the rising command address ICAR<1:N> is at a logic "high" level H. In this case, the first bit ICAR<1> of the rising command address ICAR<1:N> and the fourth bit ICAR<4> of the rising command address ICAR<1:N> may be treated as don't care bits.

Next, the logic level combination of the first to fourth bits ICAR<1:4> of the rising command address ICAR<1:N> for generating the read command RD will be described as follows.

When the test enable signal TEN is enabled at a logic "high" level H, the test decoder 232 may generate the read command RD that is enabled at a logic "high" level H when the first bit ICAR<1> of the rising command address ICAR<1:N> is at a logic "low" level L, the second bit ICAR<2> of the rising command address ICAR<1:N> is at a logic "high" level H, the third bit ICAR<3> of the rising command address ICAR<1:N> is at a logic "high" level H, and the fourth bit ICAR<4> of the rising command address ICAR<1:N> is at a logic "high" level H.

Next, the logic level combination of the first to fourth bits ICAR<1:4> of the rising command address ICAR<1:N> for generating the pre-charge command PCG will be described as follows.

Figure 5:
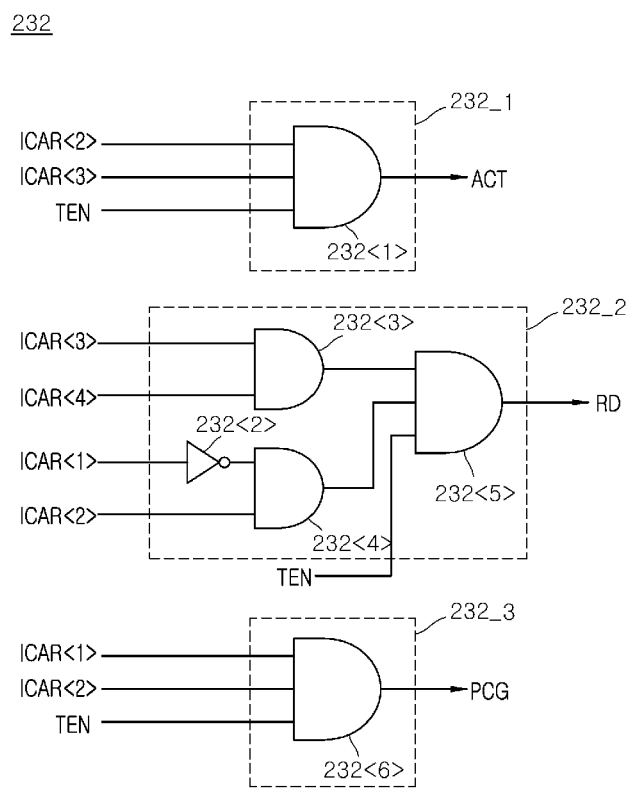
FIG. 5 is a circuit diagram illustrating a configuration according to an embodiment of the test decoder included in the command generating circuit illustrated in FIG. 3.

When the test enable signal TEN is enabled at a logic "high" level H, the test decoder 232 may generate the pre-charge command PCG that is enabled at a logic "high" level H when the first bit ICAR<1> of the rising command address ICAR<1:N> is at a logic "high" level H and the second bit ICAR<2> of the rising command address ICAR<1:N> is at a logic "high" level H. In this case, the third bit ICAR<3> of the rising command address ICAR<1:N> and the fourth bit ICAR<4> of the rising command address ICAR<1:N> may be treated as don't care bits, FIG. 5 is a circuit diagram illustrating a configuration according to an embodiment of the test decoder 232 illustrated in FIG. 3. As illustrated in FIG. 5, the test decoder 232 may include an active command generating circuit 232_1, a read command generating circuit 232_2, and a pre-charge command generating circuit 232_3.

The active command generating circuit 232_1 may be implemented with an AND gate 232_1. The active command generating circuit 232_1 may generate the active command ACT that is enabled at a logic "high" level H when a second bit ICAR<2> of the rising command address ICAR<1:N> is at a logic "high" level H and a third bit ICAR<3> of the rising command address ICAR<1:N> is at a logic "high" level H when the test enable signal TEN is enabled at a logic "high" level H.

The read command generating circuit 232_2 may be implemented with an inverter 232<2> and AND gates 232<3>, 232<4>, and 232<5>. The read command generating circuit 232_2 may generate the read command RD that is enabled at a logic "high" level H when the first bit ICAR<1> of the rising command address ICAR<1:N> is at a logic "low" level L, the second bit ICAR<2> of the rising command address ICAR<1:N> is at a logic "high" level H, the third bit ICAR<3> of the rising command address ICAR<1:N> is at a logic "high" level H, and the fourth bit ICAR<4> of the rising command address ICAR<1:N> is at a logic "high" level H when the test enable signal TEN is enabled at a logic "high" level H.

The pre-charge command generating circuit 232_3 may be implemented with an AND gate 232<6>. The pre-charge command generating circuit 232_3 may generate the pre-charge command PCG that is enabled at a logic "high" level H when the first bit ICAR<1> of the rising command address ICAR<1:N> is at a logic "high" level H, and the second bit ICAR<2> of the rising command address ICAR<1:N> is at a logic "high" level H when the test enable signal TEN is enabled at a logic "high" level H.

Figure 6:
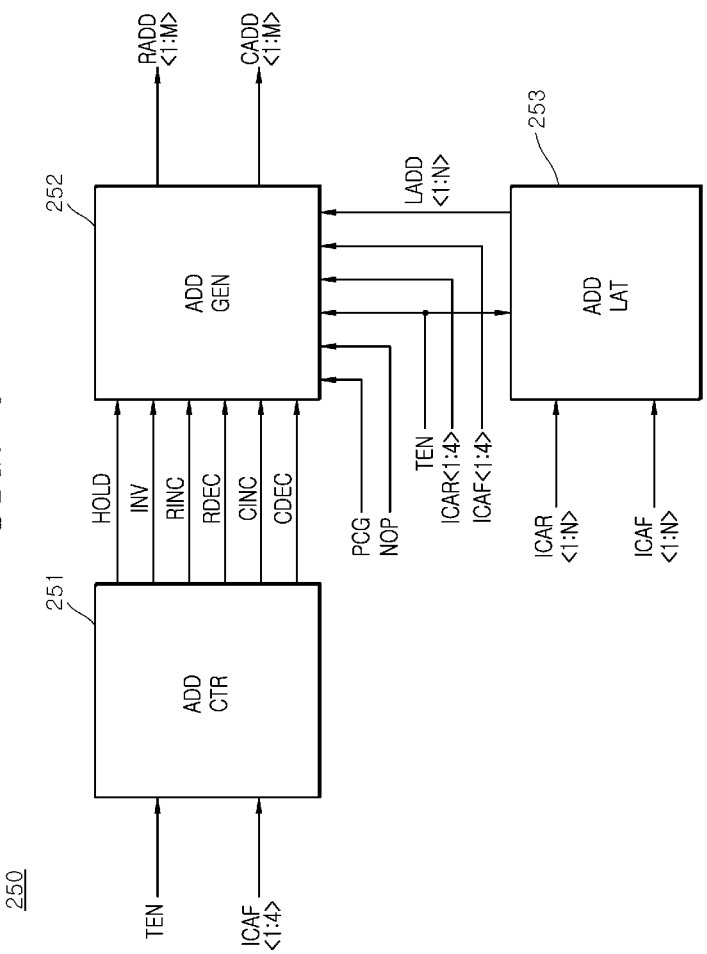
FIG. 6 is a block diagram illustrating a configuration according to an embodiment of an address decoder included in the first memory device illustrated in FIG. 2.

FIG. 6 is a block diagram illustrating a configuration according to an embodiment of the address decoder 250 illustrated in FIG. 2. As illustrated in FIG. 6, the address decoder 250 may include an address control circuit 251, an address generating circuit 252, and an address latch circuit 253.

The address control circuit 251 may generate a hold signal HOLD, an inversion signal INV, a row increment signal RINC, a row decrement signal RDEC, a column increment signal CINC, and a column decrement signal CDEC according to the logic level combinations of first to fourth bits ICAF<1:4> of the falling command address ICAF<1:N> when the test enable signal TEN is enabled. The address control circuit 251 may decode the first to fourth bits ICAF<1:4> of the falling command address ICAF<1:N> to generate the hold signal HOLD, the inversion signal INV, the row increment signal RINC, the row decrement signal RDEC, the column increment signal CINC, and the column decrement signal CDEC which are selectively enabled, when the test enable signal TEN is enabled.

The address generating circuit 252 may successively the receive the first to fourth bits ICAF<1:4> of the falling command address ICAF<1:N> by the first to fourth bits ICAR<1:4> of the rising command address ICAR<1:N> to set an initial value. The address generating circuit 252 may perform a calculation operation on the initial value according to the logic levels of the hold signal HOLD, the inversion signal INV, the row increment signal RINC, the row decrement signal RDEC, the column increment signal CINC, and the column decrement signal CDEC to generate the row address RADD<1:M> and the column address CADD<1:M> when one of the pre-charge command PCG and the operation command NOP is enabled. The address generating circuit 252 may generate the row address RADD<1:M> and the column address CADD<1:M> based on a latch address LADD<1:N> when the test enable signal TEN is disabled in the normal mode.

The address latch circuit 253 may latch the rising command address ICAR<1:N> and the falling command address ICAF<1:N> when the test enable signal TEN is disabled in the normal mode. The address latch circuit 253 may generate the latch address LADD<1:N>, based on the latched rising command address ICAR<1:N> and falling command address ICAF<1:N> when the test enable signal TEN is disabled in the normal mode.

FIGS. 7 to 9 are tables illustrating operations of the address decoder 250 illustrated in FIG. 6. The logic level combinations of the first to fourth bits ICAF<1:4> of the falling command address ICAF<1:N> for generating the hold signal HOLD, the inversion signal INV, the row increment signal RINC, the row decrement signal RDEC, the column increment signal CINC, and the column decrement signal CDEC in the address control circuit 251 according to an embodiment of the present disclosure will be described with reference to FIG. 7 as follows.

First, the operation of the address control circuit 251 generating the hold signal HOLD for performing a calculation operation (HOLD) to fix an initial value will be described as follows.

The address control circuit 251 may generate the hold signal HOLD that is enabled at a logic "low" level L when the first bit ICAF<1> of the falling command address ICAF<1:N> is at a logic "low" level L, the second bit ICAF<2> of the falling command address ICAF<1:N> is at a logic "low" level L, the third bit ICAF<3> of the falling command address ICAF<1:N> is at a logic "low" level L, and the fourth bit ICAF<4> of the falling command address ICAF<1:N> is at a logic "low" level L, when the test enable signal TEN is enabled at a logic "high" level H.

Next, the operation of the address control circuit 251 generating the inversion signal INV for performing a calculation operation (INVERSION) to invert the initial value will be described as follows.

The address control circuit 251 may generate the inversion signal INV that is enabled at a logic "low" level L when the first bit ICAF<1> of the falling command address ICAF<1:N> is at a logic "high" level H, the second bit ICAF<2> of the falling command address ICAF<1:N> is at a logic "high" level H, the third bit ICAF<3> of the falling command address ICAF<1:N> is at a logic "low" level L, and the fourth bit ICAF<4> of the falling command address ICAF<1:N> is at a logic "low" level L, when the test enable signal TEN is enabled at a logic "high" level H.

Next, the operation of the address control circuit 251 generating the row increment signal RINC and the column increment signal CINC for performing a calculation operation (INCREASE) to up-count the initial value will be described as follows.

The address control circuit 251 may generate the row increment signal RINC that is enabled at a logic "high" level H when the first bit ICAF<1> of the falling command address ICAF<1:N> is at a logic "high" level H, the third bit ICAF<3> of the falling command address ICAF<1:N> is at a logic "high" level H, and the fourth bit ICAF<4> of the falling command address ICAF<1:N> is at a logic "high" level H, when the test enable signal TEN is enabled at a logic "high" level H.

The address control circuit 251 may generate the column increment signal CINC that is enabled at a logic "high" level H when the second bit ICAF<2> of the falling command address ICAF<1:N> is at a logic "high" level H, the third bit ICAF<3> of the falling command address ICAF<1:N> is at a logic "high" level H, and the fourth bit ICAF<4> of the falling command address ICAF<1:N> is at a logic "high" level H, when the test enable signal TEN is enabled at a logic "high" level H.

Next, the operation of the address control circuit 251 generating the row decrease signal RDEC and the column decrease signal CDEC for performing a calculation operation (DECREASE) to down-count the initial value will be described as follows.

The address control circuit 251 may generate the row decrement signal RDEC that is enabled at a logic "high" level H when the first bit ICAF<1> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, when the test enable signal TEN is enabled at a logic "high" level H.

The address control circuit 251 may generate the column decrement signal CDEC that is enabled at a logic "high" level H when the second bit ICAF<2> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, when the test enable signal TEN is enabled at a logic "high" level H.

The logic level combinations of the first to fourth bits ICAF<1:4> of the falling command address ICAF<1:N> for performing the operations of up-counting the initial value and down-counting the initial value in the address control circuit 251 according to an embodiment of the present disclosure will be described with reference to FIG. 8 as follows.

First, the logic level combination of the first to fourth bits ICAF<1:4> of the falling command address ICAF<1:N> for generating the row address RADD<1:M> by down-counting the initial value (RADD DEC) and for generating the column address CADD<1:M> by down-counting the initial value (CADD DEC) will be described as follows.

When the first bit ICAF<1> of the falling command address ICAF<1:N> is at a logic "low" level L, the second bit ICAF<2> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, the logic level combination may be set for down-counting the initial value to generate the row address (RADD DEC) and for down-counting the initial value to generate the column address (CADD DEC).

Next, the logic level combination of the first to fourth bits ICAF<1:4> of the falling command address ICAF<1:N> for generating the row address by down-counting the initial value (RADD DEC) and for generating a column address by up-counting the initial value (CADD INC) will be described as follows.

When the first bit ICAF<1> of the falling command address ICAF<1:N> is at a logic "low" level L, the second bit ICAF<2> of the falling command address ICAF<1:N> is at a logic "high" level H, the third bit ICAF<3> of the falling command address ICAF<1:N> is at a logic "high" level H, and the fourth bit ICAF<4> of the falling command address ICAF<1:N> is at a logic "high" level H, the logic level combination may be set for down-counting the initial value to generate the row address (RADD DEC) and for up-counting the initial value to generate the column address (CADD INC).

Next, the logic level combination of the first to fourth bits ICAF<1:4> of the falling command address ICAF<1:N> for generating the row address by up-counting the initial value (RADD INC) and for generating the column address by down-counting the initial value (CADD DEC) will be described as follows.

When the first bit ICAF<1> of the falling command address ICAF<1:N> is at a logic "high" level H, the second bit ICAF<2> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, the logic level combination may be set for up-counting the initial value to generate the row address (RADD INC) and for down-counting the initial value to generate the column address (CADD DEC).

Next, the logic level combination of the first to fourth bits ICAF<1:4> of the falling command address ICAF<1:N> for generating the row address by up-counting the initial value (RADD INC) and for generating the column address by up-counting the initial value (CADD INC) will be described as follows.

When the first bit ICAF<1> of the falling command address ICAF<1:N> is at a logic "high" level H, the second bit ICAF<2> of the falling command address ICAF<1:N> is at a logic "high" level H, the third bit ICAF<3> of the falling command address ICAF<1:N> is at a logic "high" level H, and the fourth bit ICAF<4> of the falling command address ICAF<1:N> is at a logic "high" level H, the logic level combination may be set for up-counting the initial value to generate the row address (RADD INC) and for up-counting the initial value to generate the column address (CADD INC).

The operation of successively receiving the first to fourth bits ICAF<1:4> of the falling command address ICAF<1:N> to set the initial value in the address generating circuit 252 according to an embodiment of the present disclosure will be described with reference to FIG. 9 as follows.

In a first row address input operation (FIRST ROW INPUT), the address generating circuit 252 may receive the first bit ICAF<1> of the falling command address ICAF<1:N> as an initial value for a first bit RADD<1> of the row address RADD<1:M>, may receive the second bit ICAF<2> of the falling command address ICAF<1:N> as an initial value for a second bit RADD<2> of the row address RADD<1: may receive the third bit ICAF<3> of the falling command address ICAF<1:N> as an initial value for a third bit RADD<3> of the row address RADD<1:M>, and may receive the fourth bit ICAF<4> of the falling command address ICAF<1:N> as an initial value for a fourth bit RADD<4> of the row address RADD<1:M>.

In a second row address input operation (SECOND ROW INPUT), the address generating circuit 252 may receive the first bit ICAF<1> of the falling command address ICAF<1:N> as an initial value for a fifth bit RADD<5> of the row address RADD<1:M>, may receive the second bit ICAF<2> of the falling command address ICAF<1:N> as an initial value for a sixth bit RADD<6> of the row address RADD<1:M> may receive the third bit ICAF<3> of the falling command address ICAF<1:N> as an initial value for a seventh bit RADD<7> of the row address RADD<1:M>, and may receive the fourth bit ICAF<4> of the falling command address ICAF<1:N> as an initial value for an eighth bit RADD<8> of the row address RADD<1:M>. The initial values set in the first row address input operation (FIRST ROW INPUT) and the second row address input operation (SECOND ROW INPUT) may be set as initial values for a row internal counting signal RIC<1:M> of FIG. 15 to be described later.

In a first column address input operation (FIRST COL INPUT), the address generating circuit 252 may receive the first bit ICAF<1> of the falling command address ICAF<1:N> as an initial value for a first bit CADD<1> of the column address CADD<1:M>, may receive the second bit ICAF<2> of the falling command address ICAF<1:N> as an initial value for a second bit CADD<2> of the column address CADD<1:M>, may receive the third bit ICAF<3> of the falling command address ICAF<1:N> as an initial value for a third bit CADD<3> of the column address CADD<1:M>, and may receive the fourth bit ICAF<4> of the falling command address ICAF<1:N> as an initial value for a fourth bit CADD<4> of the column address CADD<1:M>.

In a second column address input operation (SECOND COL INPUT), the address generating circuit 252 may receive the first bit ICAF<1> of the falling command address ICAF<1:N> as an initial value for a fifth bit CADD<5> of the column address CADD<1:M>, may receive the second bit ICAF<2> of the falling command address ICAF<1:N> as an initial value for a sixth bit CADD<6> of the column address CADD<1:M>, may receive the third bit ICAF<3> of the falling command address ICAF<1:N> as an initial value for a seventh bit CADD<7> of the column address CADD<1:M>, and may receive the fourth bit ICAF<4> of the falling command address ICAF<1:N> as an initial value for an eighth bit CADD<8> of the column address CADD<1:M>. The initial values set in the first column address input operation (FIRST COL INPUT) and the second column address input operation (SECOND COL INPUT) may be set as initial values for a column internal counting signal CIC<1:M> of FIG. 16 to be described later.

In FIG. 9, although the operation of setting the initial values for the row address RADD<1:8> including the first to eighth bits and the column address CADD<1:8> including the first to eighth bits by the address generating circuit 252 has been described, the address generating circuit 252 may be implemented to set the initial values for the row address and column address including various bits according to embodiments.

Figure 10:
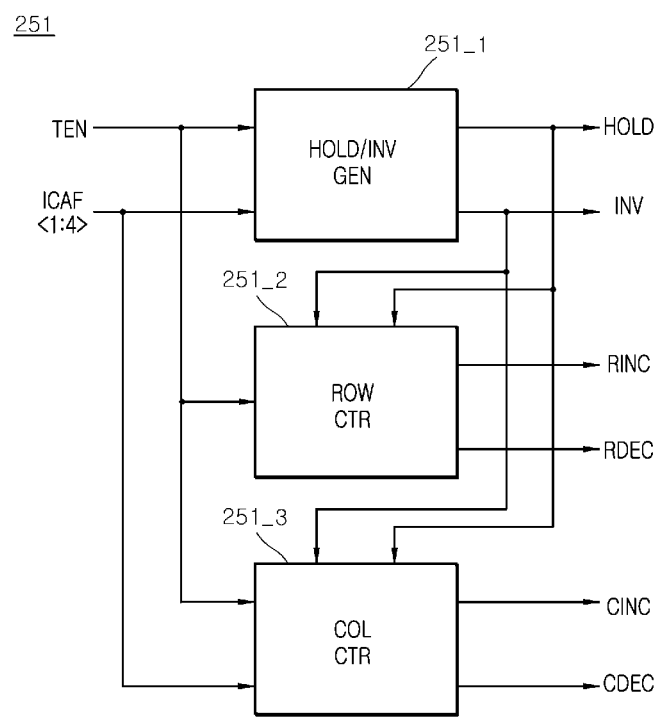
FIG. 10 is a block diagram illustrating a configuration according to an embodiment of an address control circuit included in the address decoder illustrated in FIG. 6.

FIG. 10 is a block diagram illustrating a configuration according to an embodiment of the address control circuit 251 illustrated in FIG. 6. As illustrated in FIG. 10, the address control circuit 251 may include a hold/inversion signal generating circuit 251_1, a row control signal generating circuit 251_2, and a column control signal generating circuit 251_3.

The hold/inversion signal generating circuit 251_1 may generate the hold signal HOLD that is enabled when a logic level combination of the first to fourth bits ICAF<1:4> of the falling command address ICAF<1:N> is a first logic level combination for fixing an initial value when the test enable signal TEN is enabled at a logic "high" level H. The hold/inversion signal generating circuit 251_1 may generate the inversion signal INV that is enabled when the logic level combination of the first to fourth bits ICAF<1:4> of the falling command address ICAF<1:N> is a second logic level combination for inverting the initial value when the test enable signal TEN is enabled at a logic "high" level H. The first logic level combination may be set as the logic level combination of the first to fourth bits ICAF<1:4> of the falling command address ICAF<1:N> for generating the hold signal HOLD described in FIG. 7. The second logic level combination may be set as the logic level combination of the first to fourth bits ICAF<1:4> of the falling command address ICAF<1:N> for generating the inversion signal INV described in FIG. 7.

The row control signal generating circuit 251_2 may generate the row increment signal RINC that is enabled when the logic level combination of the first to fourth bits ICAF<1:4> of the falling command address ICAF<1:N> is a third logic level combination for up-counting the initial value when the test enable signal TEN is enabled at a logic "high" level H. The row control signal generating circuit 251_2 may generate the row decrement signal RDEC that is enabled when the logic level combination of the first to fourth bits ICAF<1:4> of the falling command address ICAF<1:N> is a fourth logic level combination for down-counting the initial value when the test enable signal TEN is enabled to a logic "high" level H. The third logic level combination may be set as the logic level combination of the first to fourth bits ICAF<1:4> of the falling command address ICAF<1:N> for generating the row increment signal RINC described in FIG. 7. The fourth logic level combination may be set as the logic level combination of the first to fourth bits ICAF<1:4> of the falling command address ICAF<1:N> for generating the row decrement signal RDEC described in FIG. 7.

The column control signal generating circuit 251_3 may generate the column increment signal CINC that is enabled when the logic level combination of the first to fourth bits ICAF<1:4> of the falling command address ICAF<1:N> is a fifth logic level combination for up-counting the initial value when the test enable signal TEN is enabled at a logic "high" level H. The column control signal generating circuit 251_3 may generate the column decrement signal CDEC that is enabled when the logic level combination of the first to fourth bits ICAF<1:4> of the falling command address ICAF<1:N> is a sixth logic level combination for down-counting the initial value, when the test enable signal TEN is enabled to a logic "high" level H. The fifth logic level combination may be set as the logic level combination of the first to fourth bits ICAF<1:4> of the falling command address ICAF<1:N> for generating the column increment signal CINC described in FIG. 7. The sixth logic level combination may be set as the logic level combination of the first to fourth bits ICAF<1:4> of the falling command address ICAF<1:N> for generating the column decrement signal CDEC described in FIG. 7.

Figure 11:
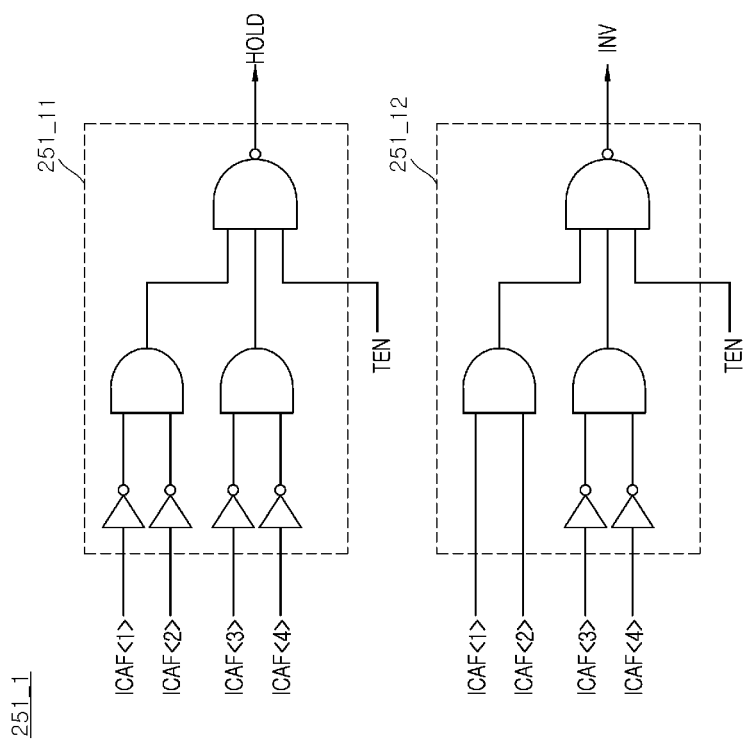
FIG. 11 is a circuit diagram illustrating a configuration according to an embodiment of a hold inversion signal generating circuit included in the address control circuit illustrated in FIG. 10.

FIG. 11 is a circuit diagram illustrating a configuration according to an embodiment of the hold/inversion signal generating circuit 251_1 illustrated in FIG. 10. As illustrated in FIG. 11, the hold/inversion signal generating circuit 251_1 may include a hold signal generating circuit 251_11 and an inversion signal generating circuit 251_12.

The hold signal generating circuit 251_11 may generate the hold signal HOLD that is enabled at a logic "low" level L when the first bit ICAF<1> of the falling command address ICAF<1:N> is at a logic "low" level L, the second bit ICAF<2> of the falling command address ICAF<1:N> is at a logic "low" level L, the third bit ICAF<3> of the falling command address ICAF<1:N> is at a logic "low" level L, and the fourth bit ICAF<4> of the falling command address ICAF<1:N> is at a logic "low" level L, when the test enable signal TEN is enabled at a logic "high" level H.

The inversion signal generating circuit 251_12 may generate the inversion signal INV that is enabled at a logic "low" level L when the first bit ICAF<1> of the falling command address ICAF<1:N> is at a logic "high" level H, the second bit ICAF<2> of the falling command address ICAF<1:N> is at a logic "high" level H, the third bit ICAF<3> of the falling command address ICAF<1:N> is at a logic "low" level L, and the fourth bit ICAF<4> of the falling command address ICAF<1:N> is at a logic "low" level L, when the test enable signal TEN is enabled at a logic "high" level H.

Figure 12:
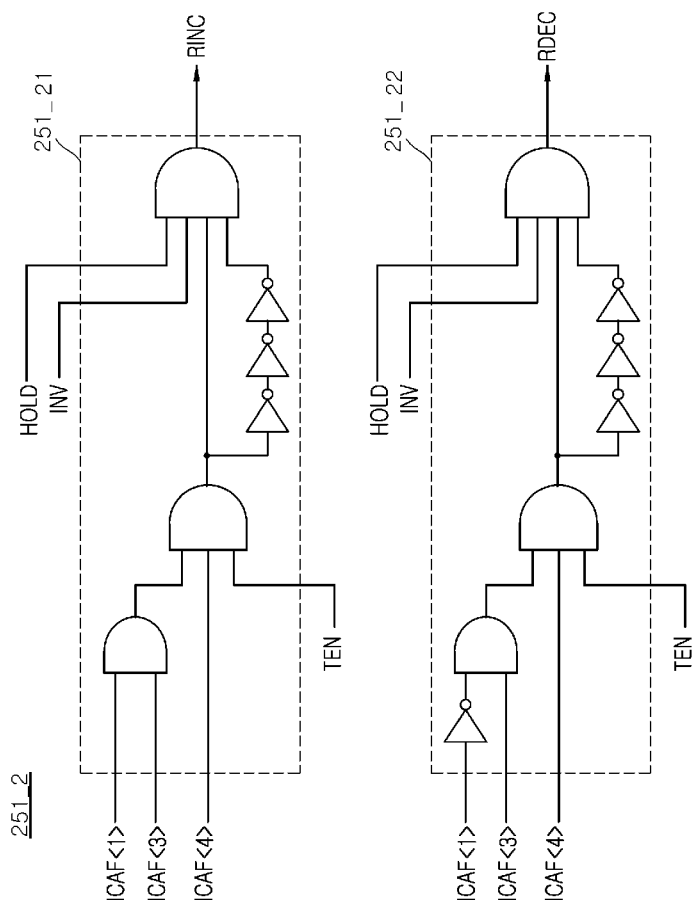
FIG. 12 is a circuit diagram illustrating a configuration according to an embodiment of a row control signal generating circuit included in the address control circuit illustrated in FIG. 10.

FIG. 12 is a circuit diagram illustrating a configuration according to an embodiment of the row control signal generating circuit 251_2 illustrated in FIG. 10. The row control signal generating circuit 251_2 may include a row increment signal generating circuit 251_21 and a row decrement signal generating circuit 251_22.

The row increment signal generating circuit 251_21 may generate the row increment signal RINC including a pulse of a logic "high" level H that is generated when the first bit ICAF<1> of the falling command address ICAF<1:N> is at a logic "high" level H, the third bit ICAF<3> of the falling command address ICAF<1:N> is at a logic "high" level H, and the fourth bit ICAF<4> of the falling command address ICAF<1:N> is at a logic "high" level H, when both the hold signal HOLD and the inversion signal INV are disabled at a logic "high" level H, and the test enable signal TEN is enabled at a logic "high" level H.

The row decrement signal generating circuit 251_22 may generate the row decrement signal RDEC including a pulse of a logic "high" level H that is generated when the first bit ICAF<1> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, when both the hold signal HOLD and the inversion signal INV are disabled at a logic "high" level H, and the test enable signal TEN is enabled at a logic "high" level H.

Figure 13:
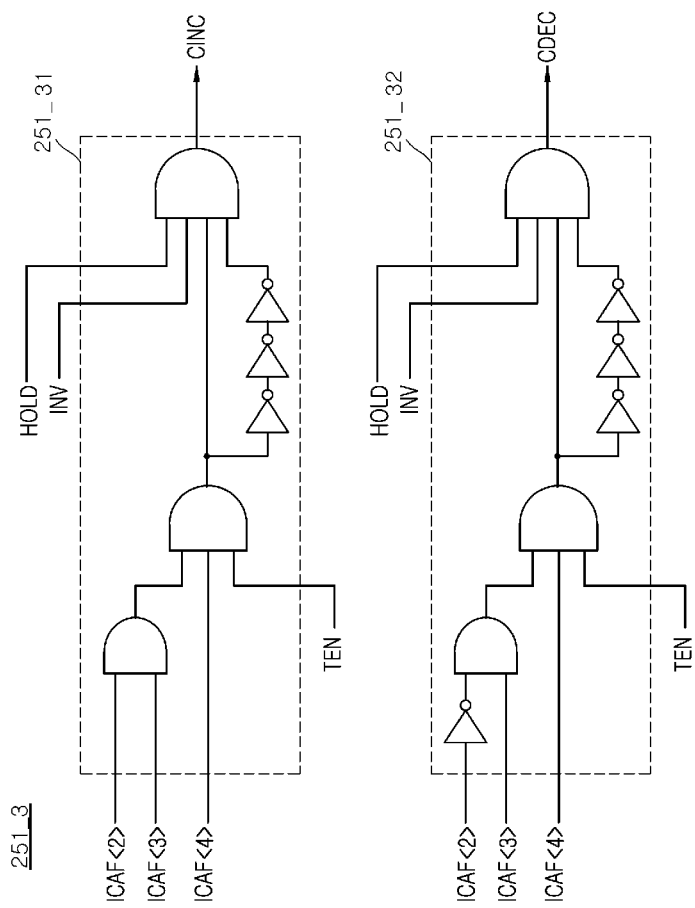
FIG. 13 is a circuit diagram illustrating a configuration according to an embodiment of a column control signal generating circuit included in the address control circuit illustrated in FIG. 10.

FIG. 13 is a circuit diagram illustrating a configuration according to an embodiment of the column control signal generating circuit 251_3 illustrated in FIG. 10. As illustrated in FIG. 13, the column control signal generating circuit 251_3 may include a column increment signal generating circuit 251_31 and a column decrement signal generating circuit 251_32.

The column increment signal generating circuit 251_31 may generate the column increment signal CINC including a pulse of a logic "high" level H that is generated when the second bit ICAF<2> of the falling command address ICAF<1:N> is at a logic "high" level H, the third hit ICAF<3> of the falling command address ICAF<1:N> is at a logic "high" level H, and the fourth bit ICAF<4> of the falling command address ICAF<1:N> is at a logic "high" level H, when both the hold signal HOLD and the inversion signal INV are disabled at a logic "high" level H, and the test enable signal TEN is enabled at a logic "high" level H.

The column decrement signal generating circuit 251_32 may generate the column decrement signal CDEC including a pulse of a logic "high" level H that is generated when the second bit ICAF<2> of the falling command address ICAF<1:N> is at a logic "low" level L, the third bit ICAF<3> of the falling command address ICAF<1:N> is at a logic "high" level H, and the fourth bit ICAF<4> of the falling command address ICAF<1:N> is at a logic "high" level H, when both the hold signal HOLD and the inversion signal INV are disabled at a logic "high" level H, and the test enable signal TEN is enabled at a logic "high" level H.

Figure 14:
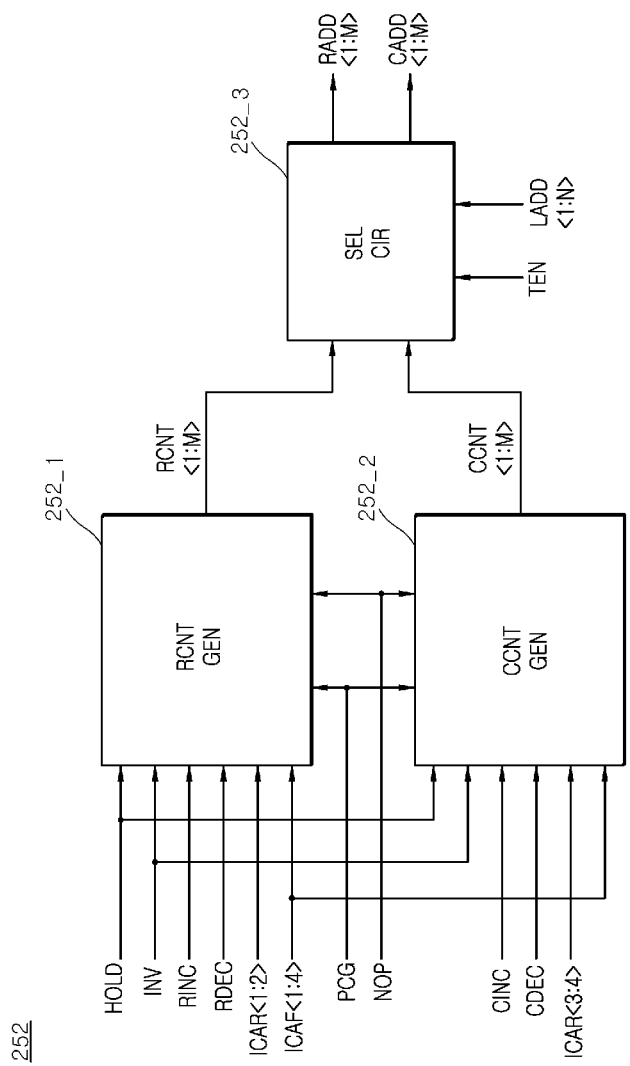
FIG. 14 is a block diagram illustrating a configuration according to an embodiment of an address generating circuit included in the address decoder illustrated in FIG. 6.

FIG. 14 is a block diagram illustrating a configuration according to an embodiment of the address generating circuit 252 illustrated in FIG. 6. As illustrated in FIG. 14, the address generating circuit 252 may include a row counting signal generating circuit 252_1, a column counting signal generating circuit 252_2, and a selection transfer circuit 252_3.

The row counting signal generating circuit 252_1 may successively receive the first to fourth bits ICAF<1:4> of the falling command address ICAF<1:N> by the first and second bits ICAR<1:2> of the rising command address ICAR<1:N> to set an initial value. The row counting signal generating circuit 252_1 may perform a calculation operation on the initial value according to the logic levels of the hold signal HOLD, the inversion signal INV, the row increment signal RINC, and the row decrement signal RDEC to generate the row counting signal RCNT<1:M> when one of the pre-charge command PCG and the operation command NOP is enabled.

The column counting signal generating circuit 252_2 may successively receive the first to fourth bits ICAF<1:4> of the falling command address ICAF<1:N> by the third and fourth bits ICAR<3:4> of the rising command address ICAR<1:N> to set the initial value. The column counting signal generating circuit 252_2 may perform a calculation operation on the initial value according to the logic levels of the hold signal HOLD, the inversion signal INV, the row increment signal RINC, and the row decrement signal RDEC to generate the column counting signal CCNT<1:M> when one of the pre-charge command PCG and the operation command NOP is enabled.

Figure 15:
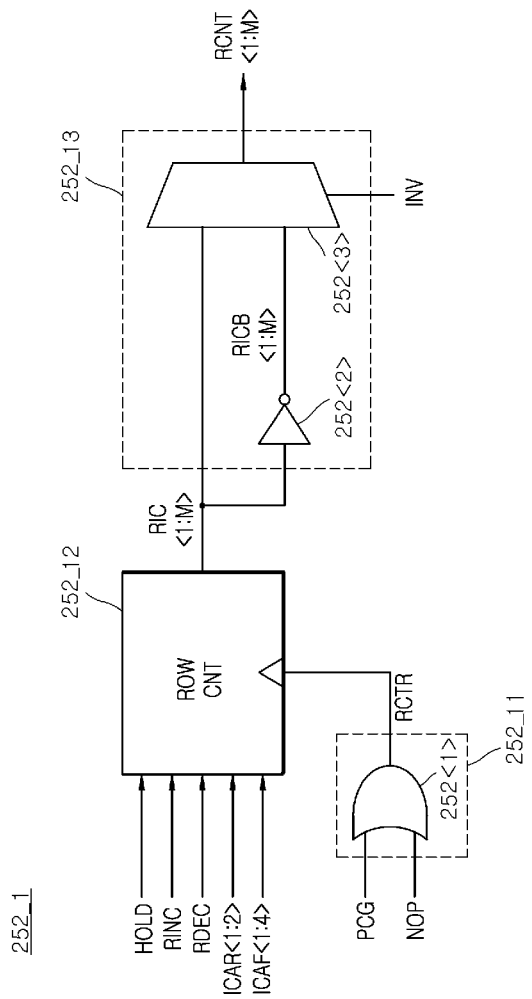
FIG. 15 is a diagram illustrating a configuration according to an embodiment of a row counting signal generating circuit included in the address generating circuit illustrated in FIG. 14.

The selection transfer circuit 252_3 may generate the row address RADD<1:M> and the column address CADD<1:M> from the row counting signal RCNT<1:M> and the column counting signal CCNT<1:M>, respectively, or may generate the row address RADD<1:M> and the column address CADD<1:M> from the latch address LADD<1:N> according to the logic level of the test enable signal TEN. The selection transfer circuit 252_3 may generate the row address RADD<1:M> and the column address CADD<1:M> from the row counting signal RCNT<1:M> and the column counting signal CCNT<1:M>, respectively, when the test enable signal TEN is enabled at a logic "high" level. The selection transfer circuit 252_3 may generate the row address RADD<1:M> and the column address CADD<1:M> from the latch address LADD<1:N> when the test enable signal TEN is disabled at a logic "low" level, FIG. 15 is a diagram illustrating a configuration according to an embodiment of the row counting signal generating circuit 252_1 illustrated in FIG. 14. As illustrated in FIG. 15, the row counting signal generating circuit 252_1 may include a row counting control signal generating circuit 252_11, a row counter 252_12, and a row selection transfer circuit 252_13.

The row counting control signal generating circuit 252_11 may be implemented with an OR gate 252<1>, The row counting control signal generating circuit 252_11 may generate a row counting control signal RCTR that is enabled at a logic "high" level when one of the pre-charge command PCG and the operation command NOP is enabled at a logic "high" level. The row counting control signal generating circuit 252_11 may perform a logical OR operation on the pre-charge command PCG and the operation command NOP to generate the row counting control signal RCTR.

The row counter 252_12 may receive first to fourth bits ICAF<1:4> of the falling command address ICAF<1:N> to set the initial value by performing a first row address input operation (FIRST ROW INPUT) when the first bit ICAR<1> of the rising command address ICAR<1:N> is enabled. The row counter 252_12 may receive the first to fourth bits ICAF<1:4> of the falling command address ICAF<1:N> to set the initial value by performing a second row address input operation (SECOND ROW INPUT) when the second bit ICAR<2> of the rising command address ICAR<1:N> is enabled. Because the first row address input operation (FIRST ROW INPUT) and the second row address input operation (SECOND ROW INPUT) are operations described with reference to FIG. 9, detailed descriptions thereof are omitted. The row counter 252_12 may generate the row internal counting signal RIC<1:M> by performing a calculation operation (HOLD) to fix the initial value when the row counting control signal RCTR is enabled and the hold signal HOLD is enabled at a logic "low" level. The row counter 252_12 may generate the row internal counting signal RIC<1:M> by performing a calculation operation (INCREASE) to up-count the initial value when the row counting control signal RCTR is enabled and a row increment signal RITC is enabled at a logic "high" level. The row counter 252_12 may generate the row internal counting signal RIC<1:M> by performing a calculation operation (DECREASE) to down-count the initial value when the row counting control signal RCTR is enabled and a row decrement signal RDEC is enabled at a logic "high" level.

The row selection transfer circuit 252_13 may be implemented with an inverter 252<2> and a multiplexer 252<3>. The inverter 252<2> may invert the row internal counting signal RIC<1:M> to generate an inverted row internal counting signal RICB<1:M>. The multiplexer 252<3> may output the row internal counting signal RIC<1:M> as the row counting signal RCNT<1:M> when the inversion signal INV is disabled at a logic "high" level. The multiplexer 252_3 may output the inverted row internal counting signal RICB<1:M> as the row counting signal RCNT<1:M> when the inversion signal INV is enabled at a logic "low" level. The row selection transfer circuit 252_13 may output the row internal counting signal RIC<1:M> as the row counting signal RCNT<1:M> when the inversion signal INV is disabled at a logic "high" level. The row selection transfer circuit 252_13 may invert the row internal counting signal RIC<1:M> to output the inverted row internal counting signal RICB<1:M> as the row counting signal RCNT<1:11> when the inversion signal INV is enabled at a logic "low" level.

Figure 16:
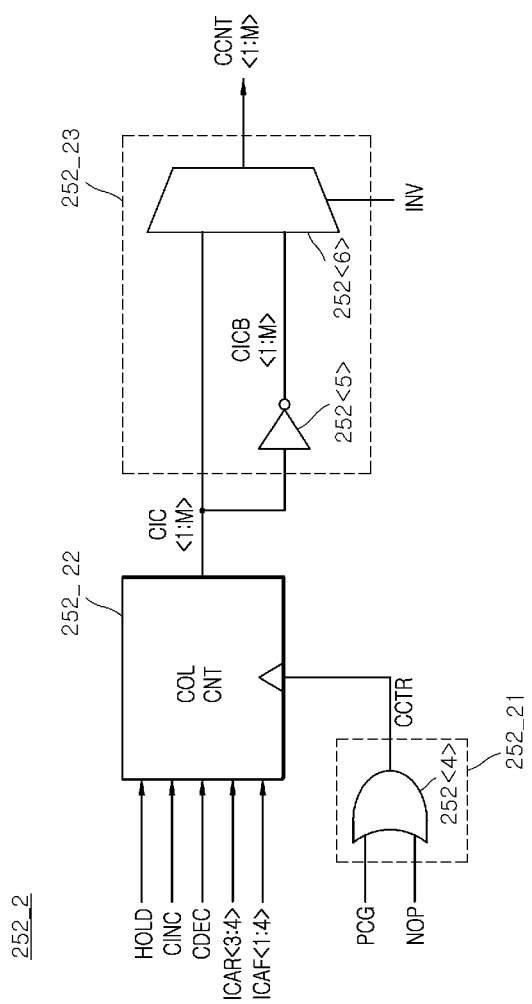
FIG. 16 is a diagram illustrating a configuration according to an embodiment of a column counting signal generating circuit included in the address generating circuit illustrated in FIG. 14.

FIG. 16 is a diagram illustrating a configuration according to an embodiment of the column counting signal generating circuit 252_2 illustrated in FIG. 14. As illustrated in FIG. 16, the column counting signal generating circuit 252_2 may include a column counting control signal generating circuit 252_21, a column counter 252_22, and a column selection transfer circuit 252_23.

The column counting control signal generating circuit 252_21 may be implemented with an OR gate 252<4>. The column counting control signal generating circuit 252_21 may generate a column counting control signal CCTR that is enabled at a logic "high" level when one of the pre-charge command PCG and the operation command NOP is enabled at a logic "high" level. The column counting control signal generating circuit 252_21 may generate the column counting control signal CCTR by performing a logical OR operation on the pre-charge command PCG and operation command NOP.

The column counter 252_22 may receive the first to fourth bits ICAF<1:4> of the falling command address ICAF<1:N> to set an initial value by performing a first column address input operation (FIRST COL INPUT) when the third bit ICAR<3> of the rising command address ICAR<1:N> is enabled. The column counter 252_22 may receive the first to fourth bits ICAF<1:4> of the falling command address ICAF<1:N> to set the initial value by performing a second column address input operation (FIRST COL INPUT) when the fourth bit ICAR<4> of the rising command address ICAR<1:N> is enabled. Because the first column address input operation (FIRST COL INPUT) and the second column address input operation (SECOND COL INPUT) are operations described in FIG. 9, detailed descriptions thereof are omitted. The column counter 252_22 may generate the column internal counting signal CIC<1:M> by performing a calculation operation (HOLD) to fix the initial value when the column counting control signal CCTR is enabled and the hold signal HOLD is enabled at a logic "low" level. The column counter 252 ... 22 may generate the column internal counting signal CIC<1:M> by performing a calculation operation (INCREASE) to up-count the initial value when the column counting control signal CCTR is enabled and the column increment signal CIRC is enabled at a logic "high" level. The column counter 252_22 may generate the column internal counting signal CIC<1:M> by performing a calculation operation (DECREASE) to down-count the initial value when the column counting control signal CCTR is enabled and the column decrement signal CDEC is enabled at a logic "high" level.

The column selection transfer circuit 252_23 may be implemented with an inverter 252<5> and a multiplexer 252<6>. The inverter 252<5> may invert the column internal counting signal CIC<1:M> to generate the inverted column internal counting signal CICB<1:M>. The multiplexer 252<6> may output the column internal counting signal CIC<1:M> as the column counting signal CCNT<1:M> when the inversion signal INV is disabled at a logic "high" level. The multiplexer 252<6> may output the inverted column internal counting signal CICB<1:M> as the column counting signal CCNT<1:M> when the inversion signal INV is enabled at a logic "low" level. The column selection transfer circuit 252_23 may output the column internal counting signal CIC<1:M> as the column counting signal CCNT<1:M> when the inversion signal INV is disabled at a logic "high" level. The column selection transfer circuit 252_23 may invert the column internal counting signal CIC<1:M> to output the inverted column internal counting signal CICB<1:M> as the column counting signal CCNT<1:M> when the inversion signal INV is enabled at a logic "low" level.

Figure 17:
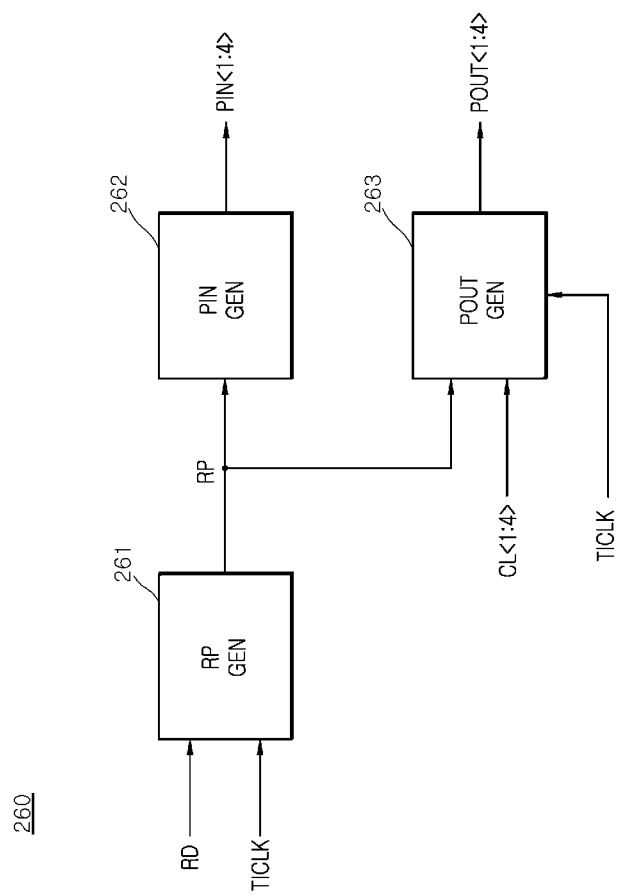
FIG. 17 is a block diagram illustrating a configuration according to an embodiment of an input/output control circuit included in the first memory device illustrated in FIG. 2.

FIG. 17 is a block diagram illustrating a configuration according to an embodiment of the input/output control circuit 260 illustrated in FIG. 2. As illustrated in FIG. 17, the input/output control circuit 260 may include a read pulse generating circuit 261, an input control signal generating circuit 262, and an output control signal generating circuit 263.

The read pulse generating circuit 261 may generate a read pulse RP including pulses that are generated in synchronization with the input test clock TICLK when the read command RD is enabled. The read pulse generating circuit 261 may generate the read pulse RP having a pulse width of the input test clock TICLK when the read command RD is enabled at a logic "high" level.

The input control signal generating circuit 262 may generate the first to fourth bits PIN<1:4> of the input control signal which are enabled when the pulse of the read pulse RP is input. The input control signal generating circuit 262 may generate the first to fourth bits PIN<1:4> of the input control signal which are sequentially enabled whenever the pulse of the read puke RP is input.

The output control signal generating circuit 263 may generate the first to fourth bits POUT<1:4> of the output control signal, based on the first to fourth bits CL<1:4> of the latency information signal when the pulse of the read puke RP is input. The output control signal generating circuit 263 may generate the first to fourth bits POUT<1:4> of the output control signal having a delay amount that is adjusted according to the logic level combinations of the first to fourth bits CL<1:4> of the latency information signal whenever the puke of the read puke RP is input. The first to fourth bits CL<1:4> of the latency information signal may be set as a signal for setting the latency section for outputting the transfer data TD<1:4> after the read command RD is input.

Figure 18:
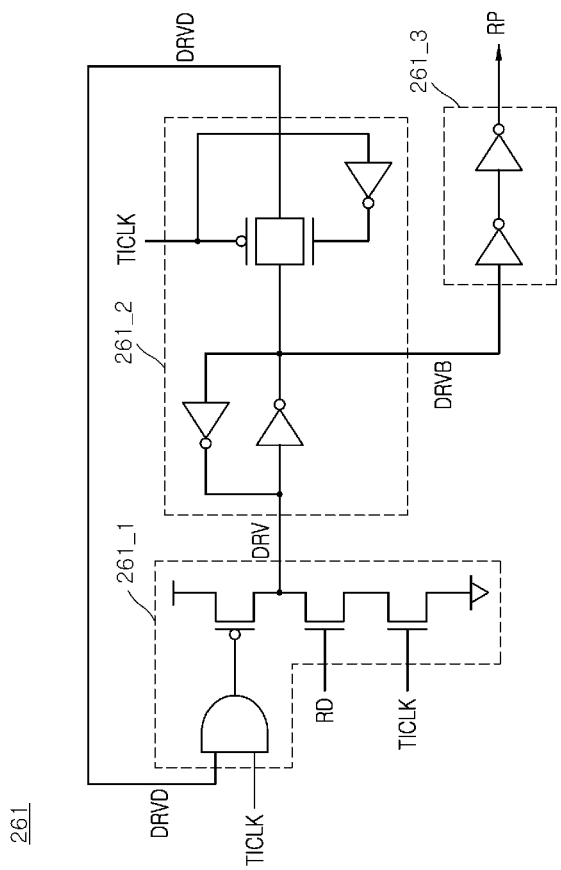
FIG. 18 is a circuit diagram illustrating a configuration according to an embodiment of a read puke generating circuit included in the input/output control circuit illustrated in FIG. 17.

FIG. 18 is a circuit diagram illustrating a configuration according to an embodiment of the read puke generating circuit 261 illustrated in FIG. 17. As illustrated in FIG. 18, the read puke generating circuit 261 may include a drive signal generating circuit 261_1, a delayed drive signal generating circuit 261_2, and a read puke output circuit 261_3.

The drive sign& generating circuit 261_1 may generate a drive signal DRV, based on the read command RD, the input test dock TICLK, and a delayed drive signal DRVD. The drive signal generating circuit 261_1 may generate a drive signal DRV of a logic "low" level when the read command RD is enabled at a logic "high" level, and the input test clock TICLK is enabled at a logic "high" level. The drive signal generating circuit 261_1 may generate a drive signal DRV of a logic "high" level when one of the input test clock TICLK and the delayed drive signal DRVD is disabled at a logic "low" level.

The delayed drive signal generating circuit 261_2 may invert the drive signal DRV to generate an inverted drive signal DRVB and the delayed drive signal DRVD according to the logic level of the input test lock TICLK. The delayed drive signal generating circuit 261_2 may invert the drive signal DRV to generate the inverted drive signal DRVB. The delayed drive signal generating circuit 261_2 may output the inverted drive signal DRVB as the delayed drive signal DRVD when the input test clock TICLK is disabled at a logic "low" level.

The read pulse output circuit 261_3 may generate the read pulse RP from the inverted drive signal DRVB. The read pulse output circuit 261_3 may buffer the inverted drive signal DRVB to generate the read pulse RP.

Figure 19:
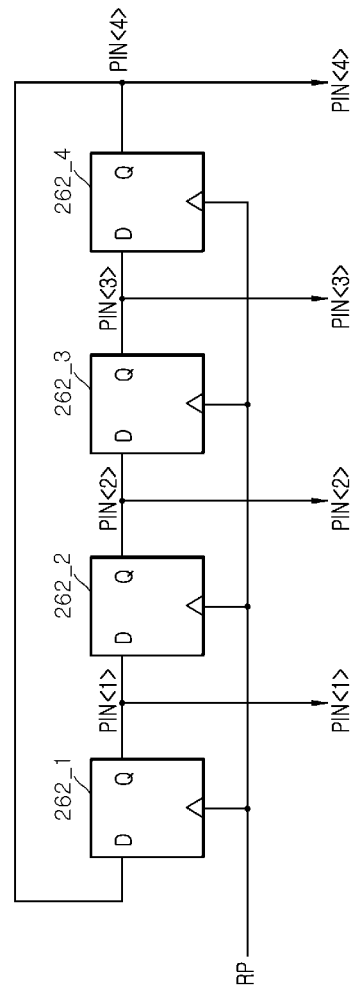
FIG. 19 is a circuit diagram illustrating a configuration according to an embodiment of an input control signal generating circuit included in the input/output control circuit illustrated in FIG. 17.

FIG. 19 is a circuit diagram illustrating a configuration according to an embodiment of the input control signal generating circuit 262 illustrated in FIG. 17. As illustrated in FIG. 19, the input control signal generating circuit 262 may be implemented with flip-flops 262_1, 262_2, 262_3, and 262_4.

The flip-flop 262_1 may generate the first bit of an input control signal PIN<1> from the fourth bit PIN<4> of the input control signal, based on the pulse of the read pulse RP. The flip-flop 262_1 may output the fourth bit PIN<4> of the input control signal as the first bit PIN<1> of the input control signal when the pulse of the read pulse RP is input.

The flip-flop 262_2 may generate the second bit PIN<2> of the input control signal from the first bit PIN<1> of the input control signal, based on the pulse of the read pulse RP. The flip-flop 262_2 may output the first bit PIN<1> of the input control signal as the second bit PIN<2> of the input control signal when the pulse of the read pulse RP is input.

The flip-flop 262_3 may generate the third bit PIN<3> of the input control signal from the second bit PIN<2> of the input control signal, based on the pulse of the read pulse RP. The flip-flop 262_3 may output the second bit PIN<2> of the input control signal as the third bit PIN<3> of the input control signal when the pulse of the read pulse RP is input.

The flip-flop 262_4 may generate the fourth bit PIN<4> of the input control signal from the third bit PIN<3> of the input control signal, based on the pulse of the read pulse RP. The flip-flop 262_4 may output the third bit PIN<3> of the input control signal as the fourth bit PIN<4> of the input control signal when the pulse of the read pulse RP is input.

Figure 20:
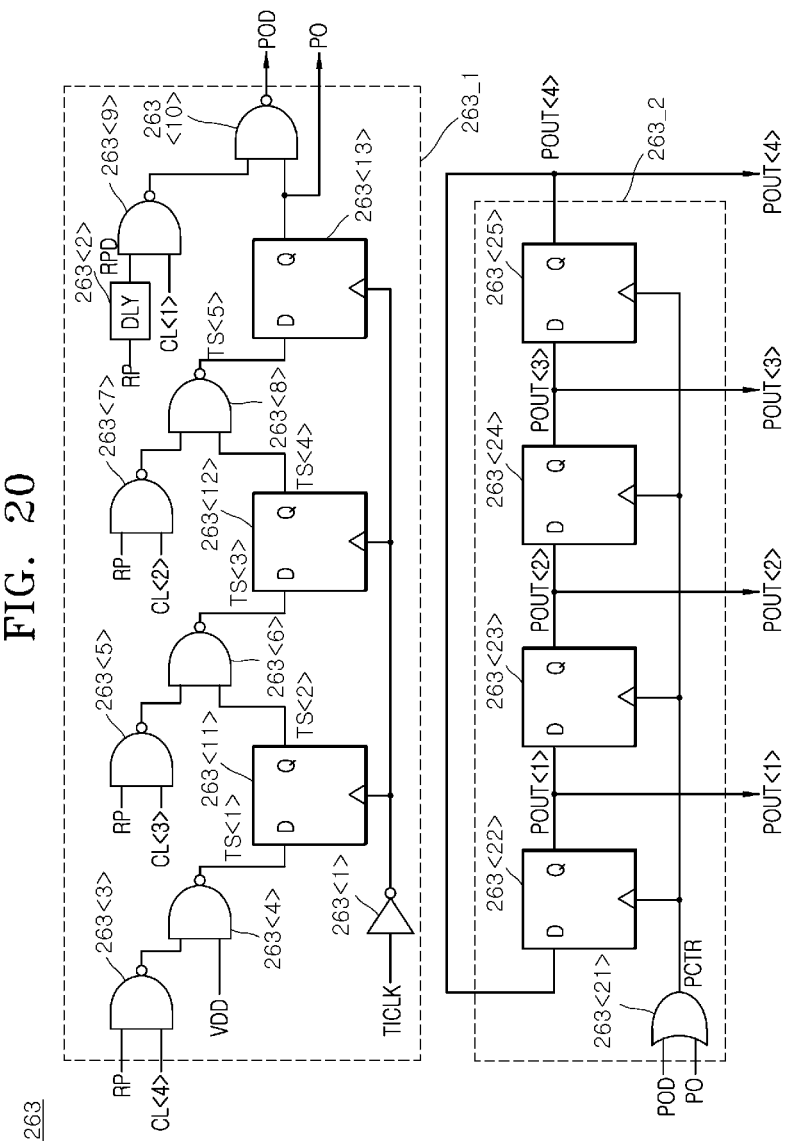
FIG. 20 is a diagram illustrating a configuration according to an embodiment of an output control signal generating circuit included in the input/output control circuit illustrated in FIG. 17.

FIG. 20 is a circuit diagram illustrating a configuration according to an embodiment of the output control signal generating circuit 263 illustrated in FIG. 17. As illustrated in FIG. 20, the output control signal generating circuit 263 may include a pipe output signal generating circuit 263_1 and an output control signal output circuit 263_2.

The pipe output signal generating circuit 263_1 may be implemented with an inverter 263<1>, a delay circuit 263<2>, NAND gates 263<3>-263<10>, and flip-flops 263<11>-263<13>.

The inverter 263<1> may invert the input test dock TICLK to output an inverted signal of the input test clock TICLK. The delay circuit 263<2> may delay the read pulse RP to generate a delayed read pulse RPD. The NAND gates 263<3> and 263<4> may buffer the read pulse RP to generate a first bit TS<1> of a transfer signal when the fourth bit CL<4> of the latency information signal is enabled at a logic "high" level. The flip-flop 263<11> may output the first bit TS<1> of the transfer signal as a second bit TS<2> of the transfer signal when an output signal of the inverter 263<1> is at a logic "high" level. The NAND gates 263<5> and 263<6> may buffer the read pulse RP to generate a third bit TS<3> of the transfer signal when the third bit CL<3> of the latency information signal is enabled at a logic "high" level and the second bit TS<2> of the transfer signal is enabled at a logic "high" level. The flip-flop 263<12> may output the third bit TS<3> of the transfer signal as the fourth bit TS<4> of the transfer signal when the output signal of the inverter 263<1> is at a logic "high" level. The NAND gates 263<7> and 263<8> may buffer the read pulse RP to generate a fifth bit of the transfer signal TS<5> when the second bit CL<2> of the latency information signal is enabled at a logic "high" level and the fourth bit TS<4> of the transfer signal is enabled at a logic "high" level. The flip-flop 263<13> may output the fifth bit TS<5> of the transfer signal as a pipe output signal PO when the output signal of the inverter 263<1> is at a logic "high" level. The NAND gates 263<9> and 263<10> may buffer the delayed read pulse RPD to generate a delayed pipe output signal POD when the first bit CL<1> of the latency information signal is enabled at a logic "high" level and the pipe output signal PO is enabled at a logic "high" level. Meanwhile, the first to fourth bits CL<1:4> of the latency information signal may be selectively generated to set a latency section in a normal mode. In a test mode, the first bit CL<1> of the latency information signal among the first to fourth bits CL<1:4> of the latency information signal may be enabled at a logic "high" level.

The output control signal output circuit 263_2 may be implemented with an OR gate 263<21> and flip-flops 263<22>-263<25>.

The OR gate 263<21> may generate a pipe control signal PCTR that is enabled at a logic "high" level when one of the pipe output signal PO and the delayed pipe output signal POD is enabled at a logic "high" level. The OR gate 263<21> may perform a logical OR operation on the pipe output signal PO and the delayed pipe output signal POD to generate the pipe control signal PCTR. The flip-flop 263<22> may generate the first bit POUT<1> of the output control signal from the fourth bit POUT<4> of the output control signal, based on the pipe control signal PCTR. The flip-flop 263<22> may output the fourth bit POUT<4> of the output control signal as the first bit POUT<1> of the output control signal when the pipe control signal PCTR is input at a logic "high" level. The flip-flop 263<23> may generate the second bit POUT<2> of the output control signal from the first bit POUT<1> of the output control signal, based on the pipe control signal PCTR. The flip-flop 263<23> may output the first bit POUT<1> of the output control signal as the second bit POUT<2> of the output control signal when the pipe control signal PCTR is input at a logic "high" level. The flip-flop 263<24> may generate the third bit POUT<3> of the output control signal from the second bit POUT<2> of the output control signal, based on the pipe control signal PCTR. The flip-flop 263<24> may output the second bit POUT<2> of the output control signal as the third bit POUT<3> of the output control signal when the pipe control signal PCTR is input at a logic "high" level. The flip-flop 263<25> may generate the fourth bit POUT<4> of the output control signal from the third bit POUT<3> of the output control signal, based on the pipe control signal PCTR. The flip-flop 263<25> may output the third bit POUT<3> of the output control signal as the fourth bit POUT<4> of the output control signal when the pipe control signal PCTR is input at a logic "high" level.

Figure 21:
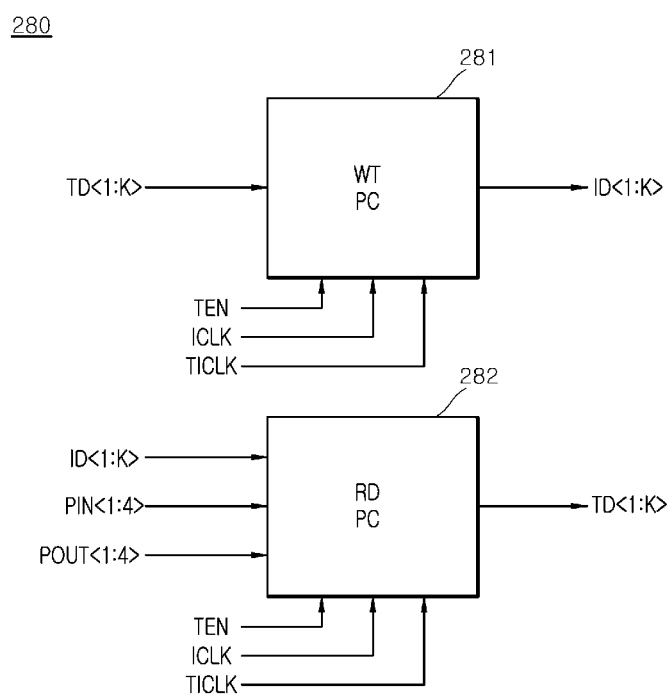
FIG. 21 is a block diagram illustrating a configuration according to an embodiment of a data processing circuit included in the first memory device illustrated in FIG. 2.

FIG. 21 is a block diagram illustrating a configuration according to an embodiment of the data processing circuit 280 illustrated in FIG. 2. As illustrated in FIG. 21, the data processing circuit 280 may include a write processing circuit 281 and a read processing circuit 282.

The write processing circuit 281 may latch the transfer data TD<1:K> that is generated from the first input data DIN1<1:K> in synchronization with the input clock ICLK when the test enable signal TEN is disabled in a write operation in a normal mode. The write processing circuit 281 may generate the internal data ID<1:K> from the latched transfer data TD<1:K> when the test enable signal TEN is disabled in the write operation in the normal mode. The write processing circuit 281 may output the internal data ID<1: K> to the core circuit (270 of FIG. 2) when the test enable signal TEN is disabled in the write operation in the normal mode.

The write processing circuit 281 may latch the transfer data TD<1:K> that is generated from the first input data DIN1<1:K> in synchronization with the input clock ICLK when the test enable signal TEN is enabled in a write operation in a test mode. The write processing circuit 281 may generate the internal data ID<1:K> from the latched transfer data TD<1:K> when the test enable signal TEN is enabled in the write operation in the test mode. The write processing circuit 281 may output the internal data ID<1:K> to the core circuit (270 of FIG. 2) when the test enable signal TEN is enabled in the write operation in the test mode.

The read processing circuit 282 may latch the internal data ID<1:K> that is output from the core circuit (270 of FIG. 2) in synchronization with the input clock ICLK when the test enable signal TEN is disabled and one of the first to fourth bits PIN<1:4> of the input control signal is enabled in a read operation in the normal mode. The read processing circuit 282 may output the latched internal data ID<1:K> as transfer data TD<1:K> in synchronization with the input clock ICLK when the test enable signal TEN is disabled and one of the first to fourth bits PIN<1:4> of the input control signal is enabled in a read operation in the normal mode.

The read processing circuit 282 may latch the internal data ID<1:K> that is output from the core circuit (270 of FIG. 2) in synchronization with the input test clock TICLK when the test enable signal TEN is enabled and one of the first to fourth bits PIN<1:4> of the input control signal is enabled in the read operation in the normal mode. The read processing circuit 282 may output the latched internal data ID<1:K> as the transfer data TD<1:K> in synchronization with the input clock ICLK when the test enable signal TEN is disabled and one of the first to fourth bits PIN<1:4> of the input control signal is enabled in a read operation in the normal mode.

The read processing circuit 282 may latch the internal data ID<1:K> that is output from the core circuit (270 of FIG. 2) in synchronization with the input test clock TICLK when the test enable signal TEN is enabled and one of the first to fourth bits PIN<1:4> of the input control signal is enabled in the read operation in the test mode. The read processing circuit 282 may output the latched internal data ID<1:K> as the transfer data TD<1:K> in synchronization with the input test clock TICLK when the test enable signal TEN is enabled and one bit of the output control signal POUT<1:4> is enabled in the read operation in the test mode.

Figure 22:
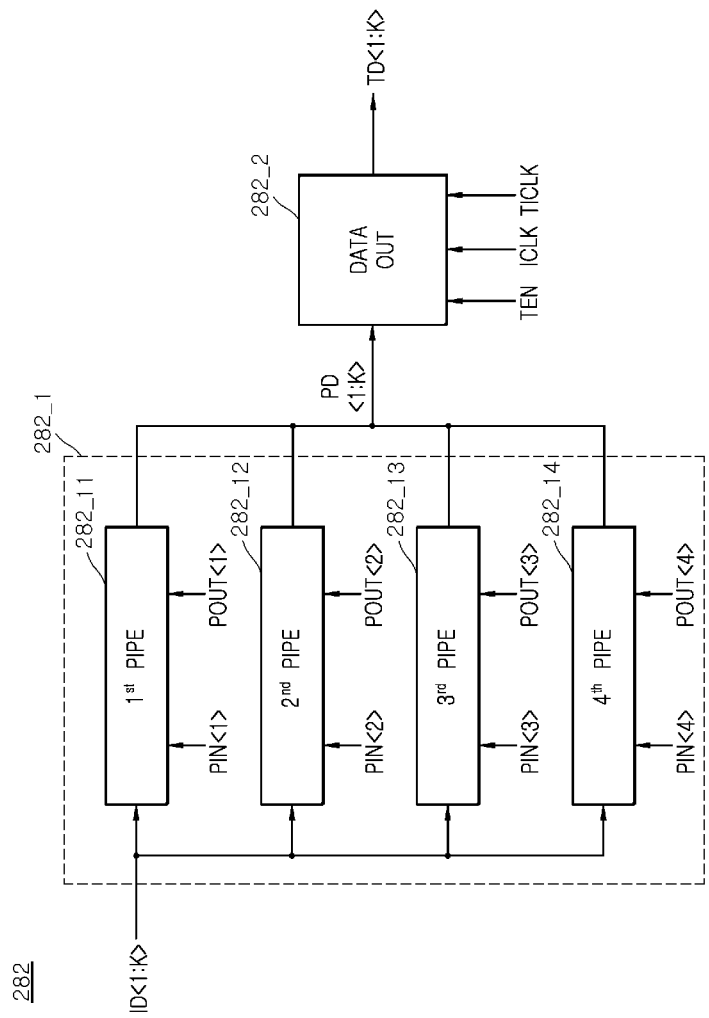
FIG. 22 is a block diagram illustrating a configuration according to an embodiment of a read processing circuit included in the data processing circuit illustrated in FIG. 21.

FIG. 22 is a block diagram illustrating a configuration according to an embodiment of the read processing circuit 282 illustrated in FIG. 21. As illustrated in FIG. 22, the read processing circuit 282 may include a pipe circuit 282_1 and a data output circuit 282_2.

The pipe circuit 282_1 may include a first pipe circuit 282_11, a second pipe circuit 282_12, a third pipe circuit 282_13, and a fourth pipe circuit 282_14. The first pipe circuit 282_11 may latch the internal data ID<1:K> when the first bit PIN<1> of the input control signal is enabled. The first pipe circuit 282_11 may output the latched internal data ID<1:K> as pipe data PD<1:K> when the first bit POUT<1> of the output control signal is enabled. The second pipe circuit 282_12 may latch the internal data ID<1:K> when the second bit PIN<2> of the input control signal is enabled. The second pipe circuit 282_12 may output the latched internal data ID<1:K> as the pipe data PD<1:K> when the second bit POUT<2> of the output control signal is enabled.

The third pipe circuit 282_13 may latch the internal data ID<1:K> when the third bit PIN<3> of the input control signal is enabled. The third pipe circuit 282_13 may output the latched internal data ID<1:K> as the pipe data PD<1:K> when the third bit POUT<3> of the output control signal is enabled. The fourth pipe circuit 282_14 may latch the internal data ID<1:K> when the fourth bit PIN<4> of the input control signal is enabled. The fourth pipe circuit 282_14 may output the latched internal data ID<1:K> as the pipe data PD<1:K> when the fourth bit POUT<4> of the output control signal is enabled.

Figure 23:
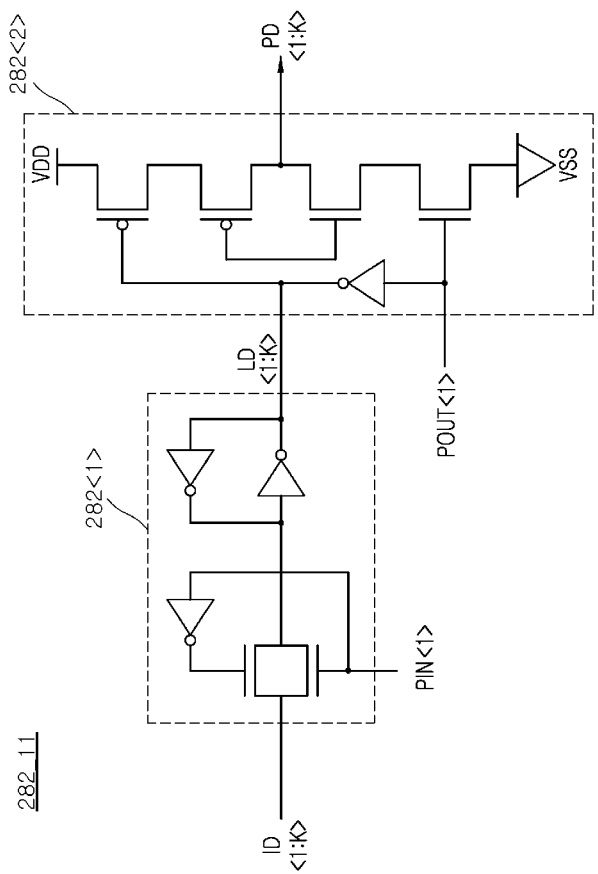
FIG. 23 is a circuit diagram illustrating a configuration according to an embodiment of a first pipe circuit included in the read processing circuit illustrated in FIG. 22.

The data output circuit 282_2 may output the pipe data PD<1:K> as the transfer data TD<1:K> in synchronization with the input clock ICLK when the test enable signal TEN is disabled. The data output circuit 282_2 may output the pipe data PD<1:K> as the transfer data TD<1:K> in synchronization with the input test clock TICLK when the test enable signal TEN is enabled, FIG. 23 is a circuit diagram illustrating a configuration according to an embodiment of the first pipe circuit 282_11 illustrated in FIG. 22. As illustrated in FIG. 23, the first pipe circuit 282_11 may include a latch data generating circuit 282<1> and a data drive circuit 282<2>.

The latch data generating circuit 282<1> may receive the internal data ID<1:K> when the first bit PIN<1> of the input control signal is enabled at a logic "high" level, and may invert the received internal data ID<1:K> to generate the latch data LD<1:K>. The latch data generating circuit 282<1> may latch the latch data LD<1: K>.

The data drive circuit 282<2> may drive the pipe data PD<1:K> according to a logic level of the latch data LD<1:K> when the first bit POUT<1> of the output control signal is enabled at a logic "high" level. For example, the data drive circuit 282<2> may drive a first bit PD<1> of the pipe data to a source voltage VDD level to generate the first bit PD<1> of the pipe data PD<1:K> of a logic "high" level when the first bit POUT<1> of the output control signal is enabled at a logic "high" level and the first bit LD<1> of the latch data LD<1:K> is at a logic "low" level. The data drive circuit 282<2> may drive the first bit PD<1> of the pipe data PD<1:K> to a ground voltage VSS level to generate the first bit PD<1> of the pipe data of a logic "low" level when the first bit POUT<1> of the output control signal is enabled at a logic "high" level and the first bit LD<1> of the latch data LD<1:K> is at a logic "high" level.

Because the second pipe circuit 282_12, the third pipe circuit 282_13, and the fourth pipe circuit 282_14 differ from the first pipe circuit 282_11 only in input signals, but are implemented as the same circuits and perform the same operations, a detailed description is omitted.

Figure 24:
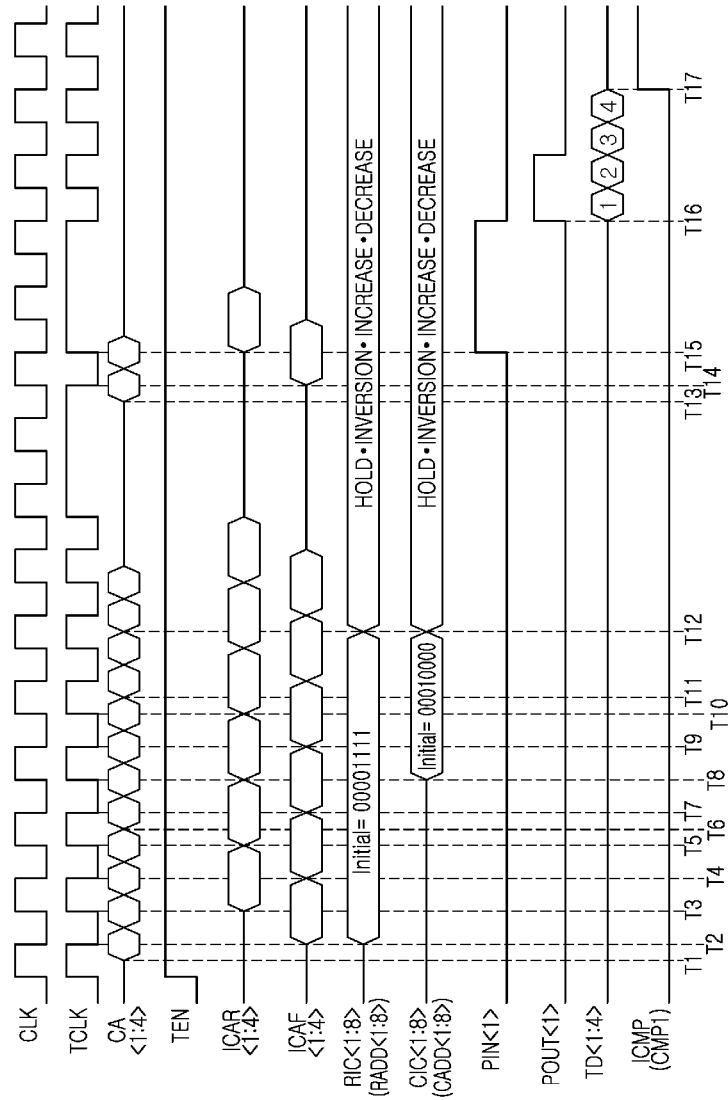
FIG. 24 is a timing diagram illustrating a test mode operation of a test system according to an embodiment of the present disclosure.

FIG. 24 is a timing diagram illustrating a test mode operation of a test system 1 according to an embodiment of the present disclosure. An operation of performing a test on the first memory device 20 in the test mode of the test system 1 according to an embodiment of the present disclosure will be described with reference to FIG. 24 as an example, together with FIGS. 1 and 2.

Prior to the description, the test device 10 of the test system 1 may output the dock CLK that is periodically toggled to control a normal mode and the test dock TCLK that is periodically toggled when entering the test mode and has a preset puke width during a read operation in the test mode. The preset puke width of the test clock TCLK is generated with a puke width greater than an address access time (tAA).

From a first point in time T1 to a sixth point in time T6, the test device 10 may successively output the first to fourth bits CA<1:4> of the command address CA<1:N> to perform a first row address input operation (FIRST ROW INPUT) and a second row address input operation (SECOND ROW INPUT).

The pad circuit 210 may receive the first to fourth bits CA<1:4> of the command address CA<1:N> to generate the first to fourth bits ICA<1:4> of the input command ICA<1:N>, may receive the test dock TCLK to generate the input test dock TICLK, and may receive the dock CLK to generate the input dock ICLK.

At a second point in time T2, the command address latch circuit 220 may latch the first to fourth bits ICA<1:4> of the input command address ICA<1:N> to generate the first to fourth bits ICAF<1:4> of the falling command address ICAF<1:N> in synchronization with a falling edge of the input test dock TICLK when the test enable signal TEN is enabled at a logic "high" level in the test mode.

At a third point in time T3, the command address latch circuit 220 may latch the first to fourth bits ICA<1:4> of the input command address ICA<1:N> to generate the first to fourth bits ICAR<1:4> of the rising command address ICAR<1:N> in synchronization with a rising edge of the input test clock TICLK when the test enable signal TEN is enabled at a logic "high" level in the test mode. At this time, the first bit ICAR<1> of the rising command to address ICAR<1:N> may be enabled at a logic "high" level.

The row counter (252_12 of FIG. 15) may receive the first to fourth bits ICAF<1:4> of the falling command address ICAF<1:N> to set an initial value by performing the first row address input operation (FIRST ROW INPUT) when the first bit ICAR<1> of the rising command address ICAR<1:N> is enabled. The first to fourth bits RIC<1:4> of the row internal counting signal RIC<1:M> having the initial value may be generated as "0000", which is the same logic level as the first to fourth bits ICAF<1:4> of the falling command address ICAF<1:N>.

At a fourth point in time T4, the command address latch circuit 220 may latch the first to fourth bits ICA<1:4> of the input command address ICA<1:N> to generate the first to fourth bits ICAF<1:4> of the falling command address ICAF<1:N> in synchronization with the falling edge of the input test clock TICLK when the test enable signal TEN is enabled at a logic "high" level in the test mode.

At a fifth point in time 15, the command address latch circuit 220 may latch the first to fourth bits ICA<1:4> of the input command address ICA<1:N> to generate the first to fourth bits ICAR<1:4> of the rising command address ICAR<1:N> in synchronization with the rising edge of the input test clock TICLK when the test enable signal TEN is enabled at a logic "high" level in the test mode. At this time, the second bit ICAR<2> of the rising command address ICAR<1:N> may be enabled at a logic "high" level.

The row counter (252_12 of FIG. 15) may receive the first to fourth bits ICAF<1:4> of the falling command address ICAF<1:N> to set the initial value by performing the second row address input operation (SECOND ROW INPUT) when the second bit ICAR<2> of the rising command address ICAR<1:N> is enabled. The fifth to eighth bits RIC<5:8> of the row internal counting signal RIC<1:M> having the initial value may be generated as "1111", which is the same logic level combination as the fifth to eighth bits ICAF<5:8> of the falling command address ICAF<1:N>. That is, the initial value may be set to "00001111".

From the sixth point in time T6 to an eleventh point in time T11, the test device 10 may successively output the first to fourth bits CA<1:4> of the command address CA<1:N> to perform a first column address input operation (FIRST COL INPUT) and a second column address input operation (SECOND COL INPUT).

At a seventh point in time T7, the command address latch circuit 220 may latch the first to fourth bits ICA<1:4> of the input command address ICA<1:N> to generate the first to fourth bits ICAF<1:4> of the falling command address ICAF<1:N> in synchronization with the falling edge of the input test clock TICLK when the test enable signal TEN is enabled at a logic "high" level in the test mode.

At an eighth point in time T8, the command address latch circuit 220 may latch the first to fourth bits ICA<1:4> of the input command address ICA<1:N> to generate the first to fourth bits ICAR<1:4> of the rising command address ICAR<1:N> in synchronization with the rising edge of the input test clock TICLK when the test enable signal TEN is enabled at a logic "high" level in the test mode. At this time, the third bit ICAR<3> of the rising command address ICAR<1:N> may be enabled at a logic "high" level.

The row counter (252_12 of FIG. 14) may receive the first to fourth bits ICAF<1:4> of the falling command address ICAF<1:N> to set the initial value by performing the first column address input operation (FIRST COL INPUT) when the third bit ICAR<3> of the rising command address ICAR<1:N> is enabled. The first to fourth bits CIC<1:4> of the column internal counting signal CIC<1:M> having the initial value may be generated as "0001", which is the same logic level combination as the first to fourth bits ICAF<1:4> of the falling command address ICAF<1:N>.

At a ninth point in time T9, the command address latch circuit 220 may latch the first to fourth bits ICA<1:4> of the input command address ICA<1:N> to generate the first to fourth bits ICAF<1:4> of the falling command address ICAF<1:N> in synchronization with the falling edge of the input test clock TICLK when the test enable signal TEN is enabled at a logic "high" level in the test mode.

At a tenth point in time T10, the command address latch circuit 220 may latch the first to fourth bits ICAF<1:4> of the input command address ICA<1:N> to generate the first to fourth bits ICAR<1:4> of the rising command address ICAR<1:N> in synchronization with the rising edge of the input test clock TICLK when the test enable signal TEN is enabled at a logic "high" level in the test mode. At this time, the fourth bit ICAR<4> of the rising command address ICAR<1:N> may be enabled at a logic "high" level.

The row counter (252_12 of FIG. 14) may receive the first to fourth bits ICAF<1:4> of the falling command address ICAF<1:N> to set the initial value by performing the second column address input operation (SECOND COL INPUT) when the fourth bit ICAR<4> of the rising command address is enabled. The fifth to eighth bits CIC<5:8> of the column internal counting signal CIC<1:M> having the initial value may be generated as "0000", which is the same logic level combination as the first to fourth bits ICAF<1:4> of the falling command address ICAF<1:N>, That is, the initial value may be set to "00010000".

From the eleventh point in time T11 to a twelfth point in time T12, the test device 10 may successively output the first to fourth bits CA<1:4> of the command address CA<1:N> for controlling the pre-charge operation and the calculation operation.

The pad circuit 210 may receive the first to fourth bits CA<1:4> of the command address CA<1:N> to generate the first to fourth bits ICA<1:4> of the input command address ICA<1:N>.

The command address latch circuit 220 may latch the first to fourth bits ICA<1:4> of the input command address ICA<1:N> to generate the first to fourth bits ICAF<1:4> of the falling command address ICAF<1:N> in synchronization with the falling edge of the input test dock TICLK when the test enable signal TEN is enabled at a logic "high" level in the test mode. The command address latch circuit 220 may latch the first to fourth bits ICA<1:4> of the input command address ICA<1:N> to generate the first to fourth bits ICAR<1:4> of the rising command address ICAR<1:N> in synchronization with the rising edge of the input test clock TICLK when the test enable signal TEN is enabled at a logic "high" level in the test mode.

The command generating circuit 230 may decode the first to fourth bits ICAR<1:4> of the rising command address ICAR<1:N> for performing the pre-charge operation to generate the pre-charge command PCG when the test enable signal TEN is enabled at a logic "high" level in the test mode.

The hold/inversion signal generating circuit (251_1 of FIG. 11) may generate the hold signal HOLD that is enabled when the logic level combination of the first to fourth bits ICAF<1:4> of the falling command address ICAF<1:N> is a first logic level combination for fixing the initial value when the test enable signal TEN is enabled at a logic "high" level. The hold/inversion signal generating circuit 251_1 may generate the inversion signal INV that is enabled when the logic level combination of the first to fourth bits ICAF<1:4> of the falling command address ICAF<1:N> is a second logic level combination for inverting the initial value when the test enable signal TEN is enabled at a logic "high" level.

The row control signal generating circuit (251_2 of FIG. 12) may generate the row increment signal RINC that is enabled when the logic level combination of the first to fourth bits ICAF<1:4> of the falling command address ICAF<1:N> is a third logic level combination for up-counting the initial value when the test enable signal TEN is enabled at a logic "high" level. The row control signal generating circuit 251_2 may generate the row decrement signal RDEC that is enabled when the logic level combination of the first to fourth bits ICAF<1:4> of the falling command address ICAF<1:N> is a fourth logic level combination for down-counting the initial value when the test enable signal TEN is enabled at a logic "high" level.

The column control signal generating circuit (251_3 of FIG. 13) may generate the column increment signal CIRC that is enabled when the logic level combination of the first to fourth bits ICAF<1:4> of the falling command address ICAF<1:N> is a fifth logic level combination for up-counting the initial value when the test enable signal TEN is enabled at a logic "high" level. The column control signal generating circuit 251_3 may generate the column decrement signal CDEC that is enabled when the logic level combination of the first to fourth bits ICAF<1:4> of the falling command address ICAF<1:N> is a sixth logic level combination for down-counting the initial value when the test enable signal TEN is enabled at a logic "high" level.

From the twelfth point in time T12, the test device 10 may output the first to fourth bits CA<1:4> of the command address CA<1:N> for performing the active operation.

The row counting signal generating circuit (252_1 of FIG. 15) may perform a calculation operation (HOLD) to fix the initial value to generate the first to eighth bits RCNT<1:8> of the row counting signal when the hold signal HOLD is enabled. When the initial value is fixed, the row counting signal generating circuit 252_1 may generate the first to eighth bits RCNT<1:8> of the row counting signal RCNT<1:8>, "00001111". The row counting signal generating circuit 252_1 may perform a calculation operation (INVERSION) to invert the initial value to generate the first to eighth bits RCNT<1:8> of the row counting signal when the inversion signal INV is enabled. When the initial value is inverted, the row counting signal generating circuit 252_1 may generate the first to eighth bits RCNT<1:8> of the row counting signal, "11110000". The row counting signal generating circuit 252_1 may perform a calculation operation (INCREASE) to up-count the initial value to generate the first to eighth bits RCNT<1:8> of the row counting signal when the row increment signal RINC is enabled. When the initial value is up-counted, the row counting signal generating circuit 252_1 may generate the first to eighth bits RCNT<1:8> of the row counting signal, "00010000". The row counting signal generating circuit 252_1 may perform a calculation operation (DECREASE) to down-count the initial value to generate the first to eighth bits RCNT 1:8> of the row counting signal when the inversion signal INV is enabled. When the initial value is down-counted, the row counting signal generating circuit 252_1 may generate the first to eighth bits RCNT<1:8> of the row counting signal, "00001110".

The column counting signal generating circuit (252_2 of FIG. 16) may perform a calculation operation (HOLD) to fix the initial value to generate the first to eighth bits CCNT<1:8> of the column counting signal when the hold signal HOLD is enabled. When the initial value is fixed, the column counting signal generating circuit 252_2 may generate the first to eighth bits CCNT<1:8> of the column counting signal, "00010000". The column counting signal generating circuit 252_2 may perform a calculation operation (INVERSION) to invert the initial value to generate the first to eighth bits CCNT<1:8> of the column counting signal when the inversion signal INV is enabled. When the initial value is inverted, the column counting signal generating circuit 252_2 may generate the first to eighth bits CCNT<1:8> of the column counting signal, "11101111". The column counting signal generating circuit 252_2 may perform a calculation operation (INCREASE) to up-count the initial value to generate the first to eighth bits CCNT<1:8> of the column counting signal when the column increment signal CINC is enabled. When the initial value is up-counted, the column counting signal generating circuit 252_2 may generate the first to eighth bits CCNT<1:8> of the column counting signal, "00010001". The column counting signal generating circuit 252_2 may perform a calculation operation (DECREASE) to down-count the initial value to generate the first to eighth bits CCNT<1:8> of the column counting signal when the inversion signal INV is enabled. When the initial value is down-counted, the column counting signal generating circuit 252_2 may generate the first to eighth bits CCNT<1:8> of the column counting signal, "00001111".

The selection transfer circuit (252_3 of FIG. 14) may generate the first to eighth bits RADD<1:8> of the row address RADD<1:M> from the first to eighth bits RCNT<1:8> of the row counting signal, and may generate the first to eighth bits CADD<1:8> of the column address CADD<1:M> from the first to eighth bits CCNT<1:8> of the column counting signal, when the test enable signal TEN is enabled at a logic "high" level.

From a thirteenth point in time T13, the test device 10 may output the first to fourth bits CA<1:4> of the command address CA<1:N> for performing a read operation.

At a fourteenth point in time T14, the command address latch circuit 220 may latch the first to fourth bits ICA<1:4> of the input command address ICA<1:N> to generate the first to fourth bits ICAF<1:4> of the falling command address ICAF<1:N> in synchronization with the falling edge of the input test dock TICLK when the test enable signal TEN is enabled at a logic "high" level in the test mode.

At a fifteenth point in time T15, the command address latch circuit 220 may latch the first to fourth bits ICA<1:4> of the input command address ICA<1:N> to generate the first to fourth bits ICAR<1:4> of the rising command address ICAR<1:N> in synchronization with the rising edge of the input test clock TICLK when the test enable signal TEN is enabled at a logic "high" level in the test mode.

The command generating circuit 230 may decode the first to fourth bits ICAR<1:4> of the rising command address ICAR<1:N for performing the read operation to generate the read command RD when the test enable signal TEN is enabled at a logic "high" level in the test mode.

The core circuit 270 may output the first to fourth bits ID<1:4> of the internal data ID<1:K> stored in a region selected by the first to eighth bits RADD<1:8> of the row address RADD<1:M> and the first to eighth bis CADD<1:8> of the column address CADD<1:M> which are generated by the calculation operation performed at the twelfth point in time T12, when the read command RD is enabled.

The input/output control circuit 260 may generate the first bit PIN<1> of the input control signal in synchronization with the input test clock TICLK when the read command RD is enabled.

The data processing circuit 280 may latch the first to fourth bits ID<1:4> of the internal data ID<1:K> output from the core circuit 270 in synchronization with the input test clock TICLK when the test enable signal TEN is enabled and the first bit of the input control signal PIN<1> is enabled.

At a sixteenth point in time T16, the input/output control circuit 260 may generate the first bit POUT<1> of the output control signal in synchronization with the input test clock TICLK after the read command RD is enabled.

The data processing circuit 280 may output the latched first to fourth bits of the internal data ID<1:4> as the first to fourth bits TD<1:4> of the transfer data TD<1:K> in synchronization with the input test clock TICLK when the test enable signal TEN is enabled and the first bit POUT<1> of the output control signal is enabled.

At a seventeenth point in time T17, the comparison signal generating circuit 290 may compare logic levels of the first to fourth bits TD<1:4> of the transfer data TD<1:K> to generate an internal comparison signal ICMP in the test mode. At this time, the comparison signal generating circuit 290 may generate the internal comparison signal ICMP that is enabled at a logic "high" level when all of the first to fourth bits TD<1:4> of the transfer data TD<1:K> are at the same logic level. If the internal comparison signal ICMP is enabled at a logic "high" level, it may mean that there is no defect in the region selected by the first to eighth bits RADD<1:8> of the row address RADD<1:M> and the first to eighth bits CADD<1:8> of the column address CADD<1:M>. If the internal comparison signal ICMP is disabled at a logic "low" level, it may mean that a defect occurs in the region selected by the first to eighth bits RADD<1:8> of the row address RADD<1:M> and the first to eighth bits CADD<1:8> of the column address CADD<1:M>.

The pad circuit 210 may receive the internal comparison signal ICMP to generate the first comparison signal CMP1 and output the first comparison signal CMP1 to the test device 10.

The test device 10 may receive the first comparison signal CMP1 to detect that there is no defect in the first memory device 20.

Meanwhile, because the test mode for the second memory device 30 is the same as the test mode for the first memory device 20, a detailed description thereof will be omitted.

Figure 25:
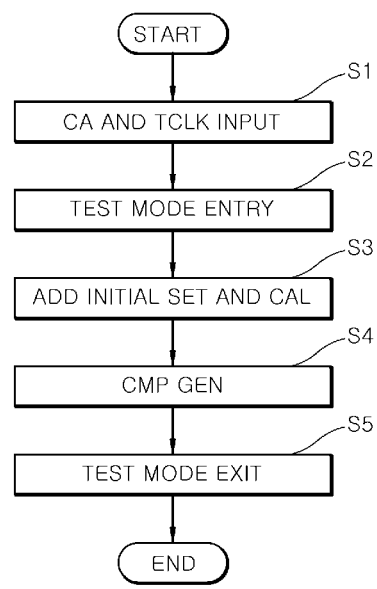
FIG. 25 is a flowchart illustrating a test method of a test system according to an embodiment of the present disclosure.

The test system 1 according to an embodiment of the present disclosure can perform test mode operations for a plurality of different memory devices through a single test device. In an embodiment, the test system 1 can reduce time and cost for performing a test by setting a pulse width of a test clock in the single test device and by performing the test mode operations on different memory devices using the test clock. In an embodiment, the test system 1 can generate a test mode result with a single pulse of the same test clock, and can reduce test cost and time by performing the test mode operations with the same test clock and the same command on the different memory devices, FIG. 25 is a flowchart illustrating a test method of a test system 1 illustrated in FIG. 1 according to an embodiment of the present disclosure. The test method of the test system 1 according to an embodiment of the present disclosure will be described with reference to FIG. 25, together with FIG. 1 as follows.

The test method may include a command address and test clock input step S1, a test mode entry step S2, an address initial value set and calculation step S3, a comparison signal generation step S4, and a test mode exit step S5.

The command address and test clock input step S1 may be set as a step in which a test device 10 outputs a command address CA, a test clock TCLK, first input data DIN1, and second input data DIN2 for controlling a test mode to a first memory device 20 and a second memory device 30. In the command address and test clock input step S1, the test device 10 may output the command address CA, the test clock TCLK, and the first input data DIN1 for controlling a test mode to the first memory device 20. In the command address and test clock input step S1, the test device 10 may output the command address CA, the test clock TCLK, and the second input data DIN2 for controlling the test mode to the second memory device 30. In the command address and test clock input step S1, the test apparatus 10 may output a test clock TCLK having a preset pulse width after outputting a periodically toggled test clock TCLK.

The test mode entry step S2 may be set as a step in which the first memory device 20 and the second memory device 30 enter the test mode. In the test mode entry step S2, the first memory device 20 may perform the test mode operation, based on the command address CA in synchronization with the periodically toggled test clock TCLK. In the test mode entry step S2, the second memory device 30 may perform the test mode operation, based on the command address CA in synchronization with the periodically toggled test clock TCLK.

The address initial value set and calculation step S3 may be set as a step in which the first memory device 20 and the second memory device 30 set an initial value of an address, perform a calculation operation on the initial value, and store the first input data DIN1 and the second input data DIN2 at locations selected by the changed logic level combination of the address. In the address initial value set and calculation step S3, the first memory device 20 may set an initial value of the address set by the command CA in synchronization with the periodically toggled test dock TCLK. In the address initial value set and calculation step S3, the second memory device 30 may set an initial value of the address set by the command CA in synchronization with the periodically toggled test clock TCLK. In the address initial value set and calculation step S3, the first memory device 20 may perform a calculation operation on the initial value set by the command address CA to change the logic level combination of the address in synchronization with the periodically toggled test dock TCLK during a pre-charge operation. In the address initial value set and calculation step S3, the second memory device 30 may perform a calculation operation on the initial value set by the command address CA to change the logic level combination of the address in synchronization with the periodically toggled test dock TCLK during the pre-charge operation. In the address initial value set and calculation step S3, the first memory device 20 may store the first input data DIN1 at a location selected by the address having a logic level combination that is changed during a write operation. In the address initial value set and calculation step S3, the second memory device 30 may store the second input data DIN2 at a location selected by the address having a logic level combination that is changed during the write operation.

The comparison signal generation step S4 may be set as a step in which the first memory device 20 and the second memory device 30 perform compression and comparison operations on the first input data DIN1 and the second input data DIN2 stored by the changed logic level combination of the address to generate a first comparison signal CMP1 and a second comparison signal CMP2. In the comparison signal generation step S4, the first memory device 20 may output first internal data generated from the first input data DIN1 stored at a location selected by an address having a logic level combination that is changed, and may compress and compare the bits included in the output first internal data to generate the first comparison signal CMP1 in synchronization with the test clock TCLK having a preset pulse width during a read operation. In the comparison signal generation step S4, the first memory device 20 may output the first comparison signal CMP1 that is generated in the read operation to the test device 10. In the comparison signal generation step S4, the second memory device 30 may output second internal data generated from the second input data DIN2 stored at a location selected by an address having a logic level combination that is changed, and may compress and compare the bits included in the output first internal data to generate the first comparison signal CMP1 in synchronization with the test clock TCLK having a preset pulse width during the read operation. In the comparison signal generation step S4, the second memory device 30 may output the second comparison signal CMP2 that is generated in the read operation to the test device 10.

The test mode exit step S5 may be set as a step in which the test device 10 receives the first comparison signal CMP1 and the second comparison signal CMP2 to detect defects of the first memory device 20 and the second memory device 30 and terminates the test mode. In the test mode exit step S5, the test device 10 may test defects of the first memory device 20 to detect a logic level of the first comparison signal CMP1. In the test mode exit step S5, the test device 10 may detect that no defect occurs in the first memory device 20 when the logic level of the first comparison signal CMP1 is enabled to a logic "high" level. In the test mode exit step S5, the test device 10 may detect that a defect occurs in the first memory device 20 when the logic level of the first comparison signal CMP1 is disabled to a logic "low" level. In the test mode exit step S5, the test device 10 may detect the logic level of the second comparison signal CMP2 to test the defect of the second memory device 30. In the test mode exit step S5, the test device 10 may detect that no defect occurs in the second memory device 30 when the logic level of the second comparison signal CMP2 is enabled to a logic "high" level. In the test mode exit step S5, the test device 10 may detect that a defect occurs in the second memory device 30 when the logic level of the second comparison signal CMP2 is disabled to a logic "low" level. In the test mode exit step S5, the test device 10 may exit the test mode after detecting whether the first memory device 20 and the second memory device 30 are defective.

In the test method of the test system 1 according to an embodiment of the present disclosure, a test mode for a plurality of different memory devices can be performed through a single test device. In an embodiment, the test method of the test system 1 can reduce the time and cost for testing by setting the puke width of the test dock in one test device and using the test clock to perform the test mode for different memory devices. In an embodiment, the test method of the test system 1 can generate a test mode result with one puke of the same test clock, and reduces test cost and time by performing the test mode with the same command and the same test clock in different memory devices.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A test system comprising:
a test device configured to output a command address and a test clock for entering a test mode and to receive a comparison signal; and
a memory device including a core circuit comprising at least one memory cell, the memory device configured to enter the test mode, based on the command address, to set an initial value by the command address, to perform a calculation operation on the initial value according to a logic level combination of the command address to generate a row address and a command address during a pre-charge operation, and to compress and compare internal data output based on the row address and the column address to output the internal data as the comparison signal to the test device.

2. The test system of claim 1, wherein the test device outputs the test clock periodically toggled to latch the command address when entering the test mode, and outputs the test clock having a preset pulse width during a read operation for outputting the internal data.

3. The test system of claim 1, wherein the test device stores a period and a preset pulse width of the test clock used in the memory device, and outputs the test clock having the preset pulse width to the memory device in the test mode.

4. The test system of claim 1,
wherein the memory device generates the row address and the column address by fixing the initial value when the command address synchronized with a falling edge of the test clock comprises a first logic level combination,
wherein the memory device generates the row address and the column address by inverting the initial value when the command address synchronized with the falling edge of the test clock comprises a second logic level combination, wherein the memory device generates the row address and the column address by up-counting the initial value when the command address synchronized with the falling edge of the test clock comprises a third logic level combination, and wherein the memory device generates the row address and the column address by down-counting the initial value when the command address synchronized with the falling edge of the test clock comprises a fourth logic level combination.

5. The test system of claim 1,
wherein the memory device includes:
   a command address latch circuit configured to latch an input command address generated from the command address to generate a rising command address and a falling command address in synchronization with one of an input clock generated from one of the rising or falling edges of the clock or an input test clock generated from the test clock, based on a test enable signal;
   a command generating circuit configured to generate an active command, a read command, and a pre-charge command according to a logic level combination of the rising command address, and to generate a mode register command for entering the test mode according to the logic level combination of the rising command address during a normal mode, based on the test enable signal;
   an address decoder configured to receive the falling command address to set the initial value according to the logic level combination of the rising command address, and to perform a calculation operation on the initial value according to a logic level combination of the falling command address to generate the row address and the column address, based on the test enable signal; and
   wherein the core circuit is configured to perform a normal mode operation based on the active command, the read command, the pre-charge command, the row address, and the column address, and to perform the test mode operation based on the read command, the row address, and the column address to output the internal data.

6. The test system of claim 5, wherein the address decoder includes:
   an address control circuit configured to generate a hold signal, an inversion signal, a row increment signal, a row decrement signal, a column increment signal, and a column decrement signal according to the logic level combination of the falling command address when the test enable signal is enabled; and
   an address generating circuit configured to successively receive the falling command address to set the initial value by the rising command address, and to perform a calculation operation on the initial value according to logic levels of the hold signal, the inversion signal, the row increment signal, the row decrement signal, the column increment signal, and the column decrement signal to generate the row address and the column address.

7. The test system of claim 6, wherein the address control circuit includes:
   a hold and inversion (hold/inversion) signal generating circuit configured to generate the hold signal when the test enable signal is enabled and the falling command address comprises a first logic level combination, and to generate the inversion signal when the falling command address comprises a second logic level combination;
   a row control signal generating circuit configured to generate the row increment signal when the test enable signal is enabled and the falling command address comprises a third logic level combination, and to generate the row decrement signal when the falling command address comprises a fourth logic level combination; and
   a column control signal generating circuit configured to generate the column increment signal when the test enable signal is enabled and the falling command address comprises a fifth logic level combination, and to generate the column decrement signal when the falling command address comprises a sixth logic level combination.

8. The test system of claim 6, wherein the address generating circuit is configured to:
   fix the initial value to output the initial value as the row address and the column address when the hold signal is enabled,
   invert the initial value to output the inverted initial value as the row address and the column address when the inversion signal is enabled,
   up-count the initial value to output the up-counted initial value as the row address and the column address when the row increment signal and the column increment signal are enabled, and
   down-count the initial value to output the down-counted initial value as the row address and the column address when the row decrement signal and the column decrement signal are enabled.

9. The test system of claim 6, wherein the address generating circuit includes:
   a row counting signal generating circuit configured to successively receive the falling command address to set the initial value by the rising command address, and to perform a calculation operation on the initial value to generate a row counting signal based on the hold signal, the inversion signal, the row increment signal, the row decrement signal, the column increment signal, and the column decrement signal;
   a column counting signal generating circuit configured to successively receive the falling command address to set the initial value by the rising command address, and to perform a calculation operation on the initial value to generate a column counting signal based on the hold signal, the inversion signal, the row increment signal, the row decrement signal, the column increment signal, and the column decrement signal; and
   a selection transfer circuit configured to generate the row address from the row counting signal and to generate the column address from the column counting signal when the test enable signal is enabled.

10. The test system of claim 9, wherein the row counting signal generating circuit includes:
   a row counter configured to successively receive the falling command address to set the initial value by the rising command address, and to perform a calculation operation on the initial value to generate a row internal counting signal based on the hold signal, the row increment signal, and the row decrement signal when the pre-charge command is input; and
   a row selection transfer circuit configured to output the row internal counting signal as the row counting signal, or to invert the row internal counting signal to output an inverted row internal counting signal as the row counting signal.

11. The test system of claim 9, wherein the column counting signal generating circuit includes:
a column counter configured to successively receive the falling command address to set the initial value by the rising command address, and to perform a calculation operation on the initial value to generate a column internal counting signal based on the hold signal, the column increment signal, and the column decrement signal when the pre-charge command is input; and
a column selection transfer circuit configured to output the column internal counting signal as the column counting signal, or to invert the column internal counting signal to output an inverted column internal counting signal as the column counting signal, based on the inversion signal.

12. The test system of claim 5, wherein the memory device further includes:
an input and output (input/output) control circuit configured to generate an input control signal and an output control signal that are generated in synchronization with the input test clock when the read command is enabled;
a data processing circuit configured to latch the internal data output from the core circuit when the input control signal is enabled, and to output the latched internal data as transfer data when the output control signal is enabled; and
a comparison signal generating circuit configured to compare logic levels of bits included in the transfer data to generate the comparison signal.

13. The test system of claim 12, wherein the input/output control circuit includes:
a read pulse generating circuit configured to generate a read pulse including a pulse having the same pulse width as a pulse width of the input test clock when the read command is enabled;
an input control signal generating circuit configured to generate the input control signal that is enabled when the pulse of the read pulse is input; and
an output control signal generating circuit configured to generate the output control signal that is enabled based on a latency information signal when the pulse of the read pulse is input.

14. The test system of claim 12, wherein the data processing circuit includes:
a pipe circuit configured to latch the internal data when the input control signal is enabled, and to output the latched internal data as pipe data when the output control signal is enabled; and
a data output circuit configured to output the pipe data as the transfer data in synchronization with the input test clock when the test enable signal is enabled.

15. A test system comprising:
a test device configured to output a command address and a test clock for entering a test mode, and to receive first and second comparison signals;
a first memory device including a first core circuit comprising at least one memory cell, the first memory device configured to enter the test mode based on the command address during a normal mode, to output first internal data of a location selected by performing a calculation operation on a first initial value set by the command address, and to compress and compare the first internal data to output as the first comparison signal to the test device; and
a second memory device including a second core circuit comprising at least one memory cell, the second memory device configured to enter the test mode based on the command address during the normal mode, to output second internal data of a location selected by performing a calculation operation on a second initial value set by the command address, and to compress and compare the second internal data to output as the second comparison signal to the test device,
wherein the first memory device and the second memory device have different operation characteristics from each other.

16. The test system of claim 15, wherein the test device outputs the test clock that is periodically toggled to latch the command address when entering the test mode, and outputs the test clock having a preset pulse width during a read operation for outputting the internal data.

17. The test system of claim 15, wherein the test device stores a period and a preset pulse width of the test clock used in the memory device, and outputs the test clock having the preset pulse width to the memory device in the test mode.

18. The test system of claim 15,
wherein the first memory device outputs the first internal data from a location selected by a first row address and a first column address that are generated from the command address in the normal mode, and
wherein the first memory device performs a calculation operation on the first initial value set by the command address to generate the first row address and the first column address, and outputs the first internal data from the location selected by the first row address and the first column address in the test mode.

19. The test system of claim 18,
wherein the first memory device generates the first row address and the first column address by fixing the first initial value when the command address synchronized with a falling edge of the test clock comprising a first logic level combination,
wherein the first memory device generates the first row address and the first column address by inverting the first initial value when the command address synchronized with the falling edge of the test clock comprising a second logic level combination,
wherein the first memory device generates the first row address and the first column address by up-counting the first initial value when the command address synchronized with the falling edge of the test clock comprising a third logic level combination, and
wherein the first memory device generates the first row address and the first column address by down-counting the first initial value when the command address synchronized with the falling edge of the test clock comprising a fourth logic level combination.

20. The test system of claim 15,
wherein the second memory device outputs the second internal data from a location selected by a second row address and a second column address generated from the command address in the normal mode, and
wherein the second memory device performs a calculation operation on the second initial value set by the command address to generate the second row address and the second column address, and outputs the second internal data from a location selected by the second row address and the second column address.

21. The test system of claim 20,
wherein the second memory device generates the second row address and the second column address by fixing the second initial value when the command address synchronized with a falling edge of the test clock comprises a fifth logic level combination,
wherein the second memory device generates the second row address and the second column address by inverting the second initial value when the command address synchronized with the falling edge of the test clock comprises a sixth logic level combination,
wherein the second memory device generates the second row address and the second column address by up-counting the second initial value when the command address synchronized with the falling edge of the test clock comprises a seventh logic level combination, and
wherein the second memory device generates the second row address and the second column address by down-counting the second initial value when the command address synchronized with the falling edge of the test clock comprises an eighth logic level combination.

22. The test system of claim 15,
wherein the first memory device includes:
a first command address latch circuit configured to latch a first input command address generated from the command address to generate a first rising command address and a first falling command address in synchronization with one of a first input clock generated from one of the rising or falling edges of the clock or a first input test clock generated from the test clock, based on a first test enable signal;
a first command generating circuit configured to generate a first active command, a first read command, and a first pre-charge command according to a logic level combination of the first rising command address based on the first test enable signal, and to generate a first mode register command for entering the test mode according to the logic level combination of the first rising command address during the normal mode;
a first address decoder configured to receive the first falling command address to set the first initial value according to the logic level combination of the first rising command address, based on the first test enable signal, and to perform a calculation operation on the first initial value to generate the first row address and the first column address according to the logic level combination of the first falling command address; and
wherein the first core circuit configured to perform a normal mode operation based on the first active command, the first read command, the first pre-charge command, the first row address, and the first column address, and to perform a test mode operation based on the first read command, the first row address, and the first column address to output the first internal data; and
wherein the first memory device includes a first comparison signal generating circuit configured to compare logic levels of bits included in first transfer data generated from the first internal data to generate the first comparison signal.

23. The test system of claim 22, wherein the first address decoder includes:
a first address control circuit configured to generate a first hold signal, a first inversion signal, a first row increment signal, a first row decrement signal, a first column increment signal, and a first column decrement signal according to the logic level combination of the first falling command address when the first test enable signal is enabled; and
a first address generating circuit configured to successively receive the first falling command address to set the first initial value by the first rising command address, and to perform a calculation operation on the first initial value according to logic levels of the first hold signal, the first inversion signal, the first row increment signal, the first row decrement signal, the first column increment signal, and the first column decrement signal to generate the first row address and the first column address.

24. The test system of claim 23, wherein the first address generating circuit is configured to:
fix the first initial value to output the first initial value as the first row address and the first column address when the first hold signal is enabled,
invert the first initial value to output an inverted first initial value as the first row address and the first column address when the first inversion signal is enabled,
up-count the first initial value to output an up-counted first initial value as the first row address and the first column address when the first row increment signal and the first column increment signal are enabled, and
down-count the first initial value to output a down-counted first initial value as the first row address and the first column address when the first row decrement signal and the first column decrement signal are enabled.

25. The test system of claim 15,
wherein the second memory device includes:
a second command address latch circuit configured to latch a second input command address generated from the command address to generate a second rising command address and a second falling command address in synchronization with one of a second input clock generated from one of the rising or falling edges of the clock or a second input test clock generated from the test clock, based on a second test enable signal;
a second command generating circuit configured to generate a second active command, a second read command, and a second pre-charge command according to a logic level combination of the second rising command address, and to generate a second mode register command for entering the test mode according to the logic level combination of the second rising command address during the normal mode, based on the second test enable signal;
a second address decoder configured to receive the second falling command address to set a second initial value according to the logic level combination of the second rising command address, and to perform a calculation operation on the second initial value according to the logic level combination of the second falling command address to generate the second row address and the second column address, based on the second test enable signal; and
wherein the second core circuit is configured to perform a normal mode operation based on the second active command, the second read command, the second pre-charge command, the second row address, and the second column address, and to perform a test mode operation based on the second read command, the second row address, and the second column address to output the second internal data; and wherein the second memory device includes a second comparison signal generating circuit configured to compare logic levels of bits included in second transfer data generated from the second internal data to generate the second comparison signal.

26. The test system of claim 25, wherein the second address decoder includes:
a second address control circuit configured to generate a second hold signal, a second inversion signal, a second row increment signal, a second row decrement signal, a second column increment signal, and a second column decrement signal according to the logic level combination of the second falling command address when the second test enable signal is enabled; and
a second address generating circuit configured to successively receive the second falling command address to set the second initial value by the second rising command address, and to perform a calculation operation on the second initial value according to logic levels of the second hold signal, the second inversion signal, the second row increment signal, the second row decrement signal, the second column increment signal, and the second column decrement signal to generate the second row address and the second column address.

27. The test system of claim 26, wherein the second address generating circuit is configured to:
fix the second initial value to output the second initial value as the second row address and the second column address when the second hold signal is enabled,
invert the second initial value to output an inverted second initial value as the second row address and the second column address when the second inversion signal is enabled,
up-count the second initial value to output an up-counted second initial value as the second row address and the second column address when the second row increment signal and the second column increment signal are enabled, and
down-count the second initial value to output a down-counted second initial value as the second row address and the second column address when the second row decrement signal and the second column decrement signal are enabled.

28. A test method comprising:
a command address and test clock input step of outputting a command address, a test clock, and first and second input data for controlling a test mode operation; and
a test mode entry step of entering a test mode based on the command address in synchronization with one of the rising or falling edges of the test clock,
wherein the command address and the test clock are output to a first memory device and a second memory device that have different operation characteristics, the first input data is output to the first memory device, and the second input data is output to the second memory device.

29. The test method of claim 28, wherein the test clock is periodically toggled to latch the command address when entering the test mode and has a preset pulse width during a read operation in the test mode.

30. The test method of claim 28, wherein the command address, the test clock, and the first and second input data are output from a test device to the first memory device and the second memory device.

31. The test method of claim 30, wherein the test device stores a period and a preset pulse width of the test clock used in the first and second memory devices, and outputs the test clock having the preset pulse width to the first and second memory devices in the test mode.

32. The test method of claim 28, further comprising an address initial value set and calculation step of setting an initial value of an address by the command address in synchronization with the test clock in the test mode, changing a logic level combination of the address by performing a calculation operation on the initial value of the address, and storing the first input data and the second input data at a location selected by the address having a logic level combination that is changed.

33. The test method of claim 32, wherein the first memory device and the second memory device perform calculation operations on the initial value of the address during a pre-charge operation in the test mode to change the logic level combination of the address, and store the first input data and the second input data at a location selected by the address having a logic level combination that is changed during a write operation in the test mode.

34. The test method of claim 28, further comprising:
a comparison signal generation step of generating a first comparison signal and a second comparison signal by performing a compression and comparison operations on the first input data and the second input data stored by the logic level combination of the address in the test mode; and
a test mode exit step of detecting defects in the first memory device and the second memory device by detecting logic levels of the first comparison signal and the second comparison signal.

35. The test method of claim 34, wherein in the comparison signal generation step,
the first memory device outputs first internal data generated from the first input data during a read operation in the test mode, and compresses and compares bits included in the first internal data to generate the first comparison signal, and
the second memory device outputs second internal data generated from the second input data during the read operation in the test mode, and compresses and compares bits included in the second internal data to generate the second comparison signal.

36. The test method of claim 35, wherein in the test mode exit step, the first memory device outputs the first comparison signal to a test device, the second memory device outputs the second comparison signal to the test device, the test device receives the first comparison signal to detect a defect in the first memory device, and the test device receives the second comparison signal to detect a defect in the second memory device.

* * * * *